(12) United States Patent
Tanaka et al.

(10) Patent No.: US 8,248,782 B2
(45) Date of Patent: Aug. 21, 2012

(54) STORAGE APPARATUS, STORAGE CONTROLLER FOR STORAGE APPARATUS, CHASSIS FOR STORAGE CONTROLLER

(75) Inventors: Shigeaki Tanaka, Odawara (JP); Kentaro Abe, Oiso (JP)

(73) Assignee: Hitachi, Ltd., Tokyo (JP)

( * ) Notice: Subject to any disclaimer, the term of this patent is extended or adjusted under 35 U.S.C. 154(b) by 358 days.

(21) Appl. No.: 12/525,995

(22) PCT Filed: Jun. 26, 2009

(86) PCT No.: PCT/JP2009/002946
§ 371 (c)(1),
(2), (4) Date: Aug. 5, 2009

(87) PCT Pub. No.: WO2010/150320
PCT Pub. Date: Dec. 29, 2010

(65) Prior Publication Data
US 2011/0157811 A1 Jun. 30, 2011

(51) Int. Cl.
*H05K 7/20* (2006.01)
(52) U.S. Cl. ............. 361/679.5; 361/679.48; 361/692; 361/693; 361/694; 361/695; 361/707
(58) Field of Classification Search ............. 361/679.5, 361/679.48, 692–695, 707
See application file for complete search history.

(56) References Cited

U.S. PATENT DOCUMENTS

| | | | | |
|---|---|---|---|---|
| 5,361,188 A * | 11/1994 | Kondou et al. | ............... | 361/695 |
| 5,414,591 A | 5/1995 | Kimura | | |
| 6,134,109 A * | 10/2000 | Muller et al. | ................. | 361/700 |
| 6,398,505 B1 | 6/2002 | Sekiguchi | | |
| 7,079,387 B2 * | 7/2006 | Brooks et al. | ............ | 361/679.51 |
| 7,411,787 B2 * | 8/2008 | Katakura et al. | .............. | 361/695 |
| 7,766,733 B2 * | 8/2010 | Kasahara et al. | ............. | 454/184 |
| 2006/0039108 A1 * | 2/2006 | Chikusa et al. | ............... | 361/695 |
| 2007/0006239 A1 * | 1/2007 | Kasahara et al. | ............. | 720/601 |
| 2009/0059520 A1 | 3/2009 | Tanaka | | |

FOREIGN PATENT DOCUMENTS

| EP | 1746483 A1 | 1/2007 |
|---|---|---|
| JP | 2009-53978 | 3/2009 |

* cited by examiner

*Primary Examiner* — Hung S Bui
*Assistant Examiner* — James Wu
(74) *Attorney, Agent, or Firm* — Brundidge & Stanger, P.C.

(57) ABSTRACT

A storage apparatus S comprises a disk controller 1 for controlling data I/O processing between a host H and a disk unit 2. The disk controller 1 includes a plurality of circuit board modules each having a circuit board 210 and a module case 200 storing the same, and a chassis 100 shaped like a hollow cylinder having a front side opening and a rear side opening and configured to store the circuit board modules from the front and rear side openings. A CM module 20 is configured to introduce cooling air from a cooling fan 10F through an opening provided on at least one side surface toward a circuit component mounted on the circuit board 210. A MP module 30 is configured to introduce cooling air by a cooling fan 10R through an opening provide on a front surface of the module case 200.

13 Claims, 21 Drawing Sheets

[Fig. 1A]
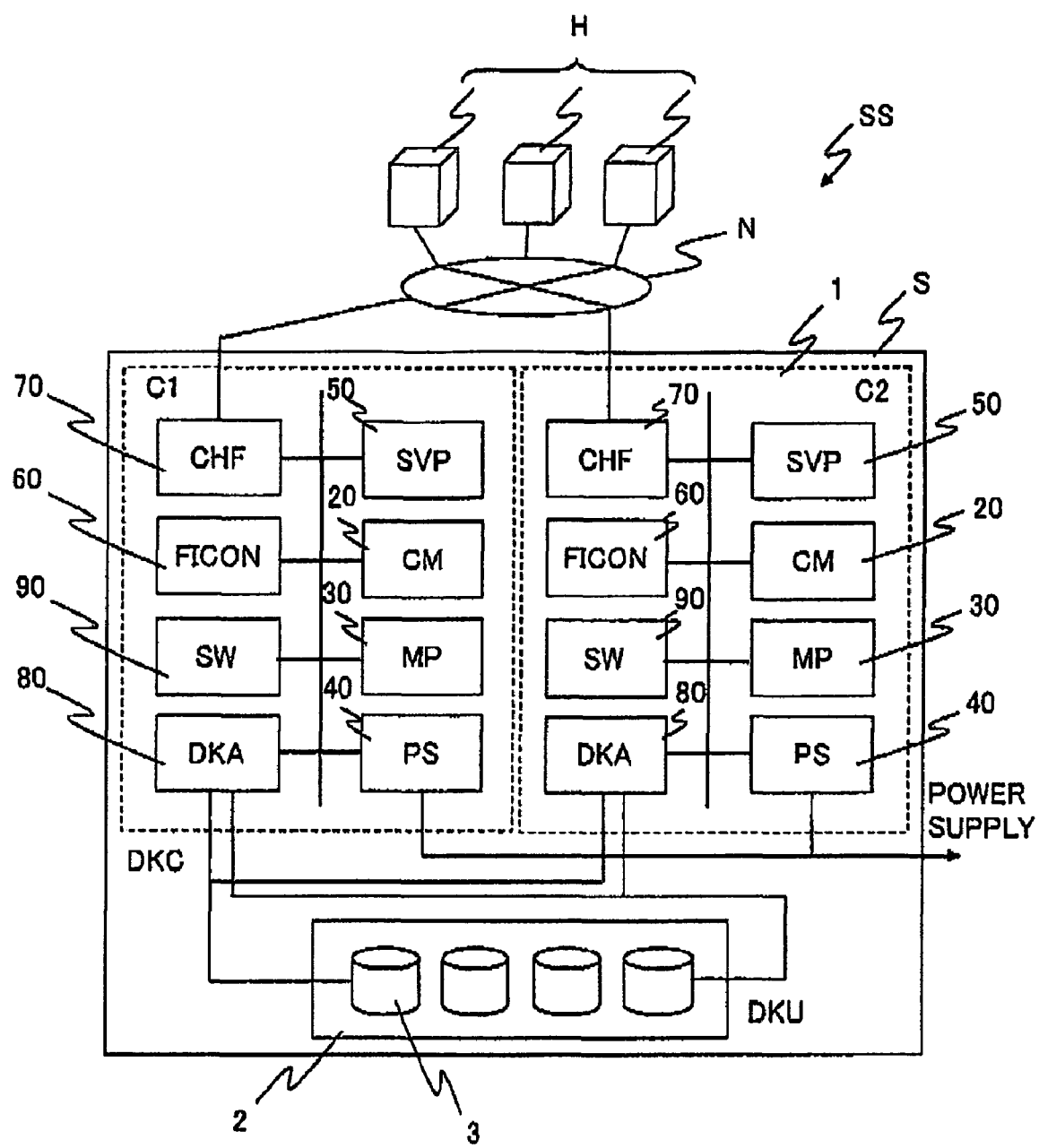

[Fig. 1B]
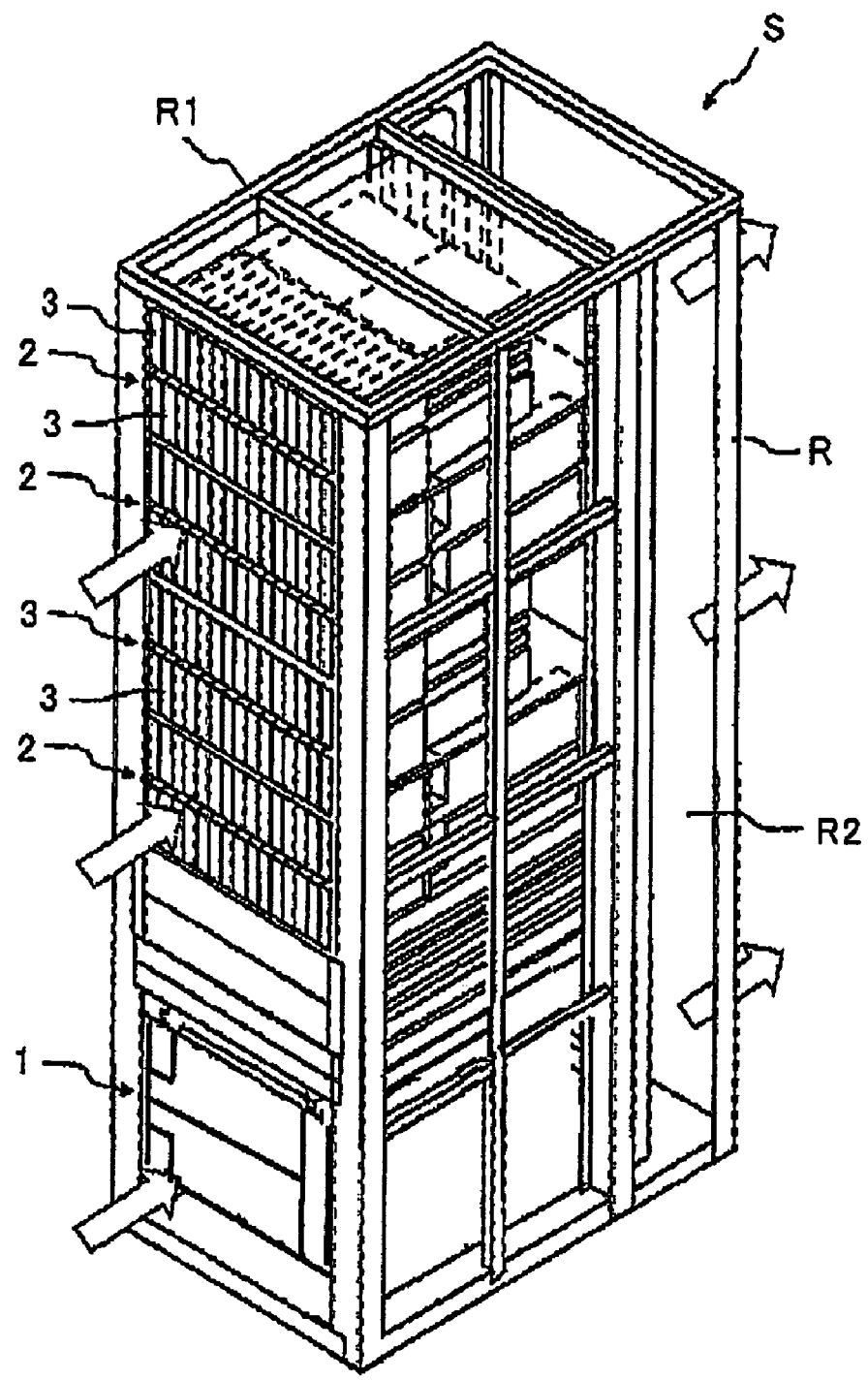

[Fig. 2A]
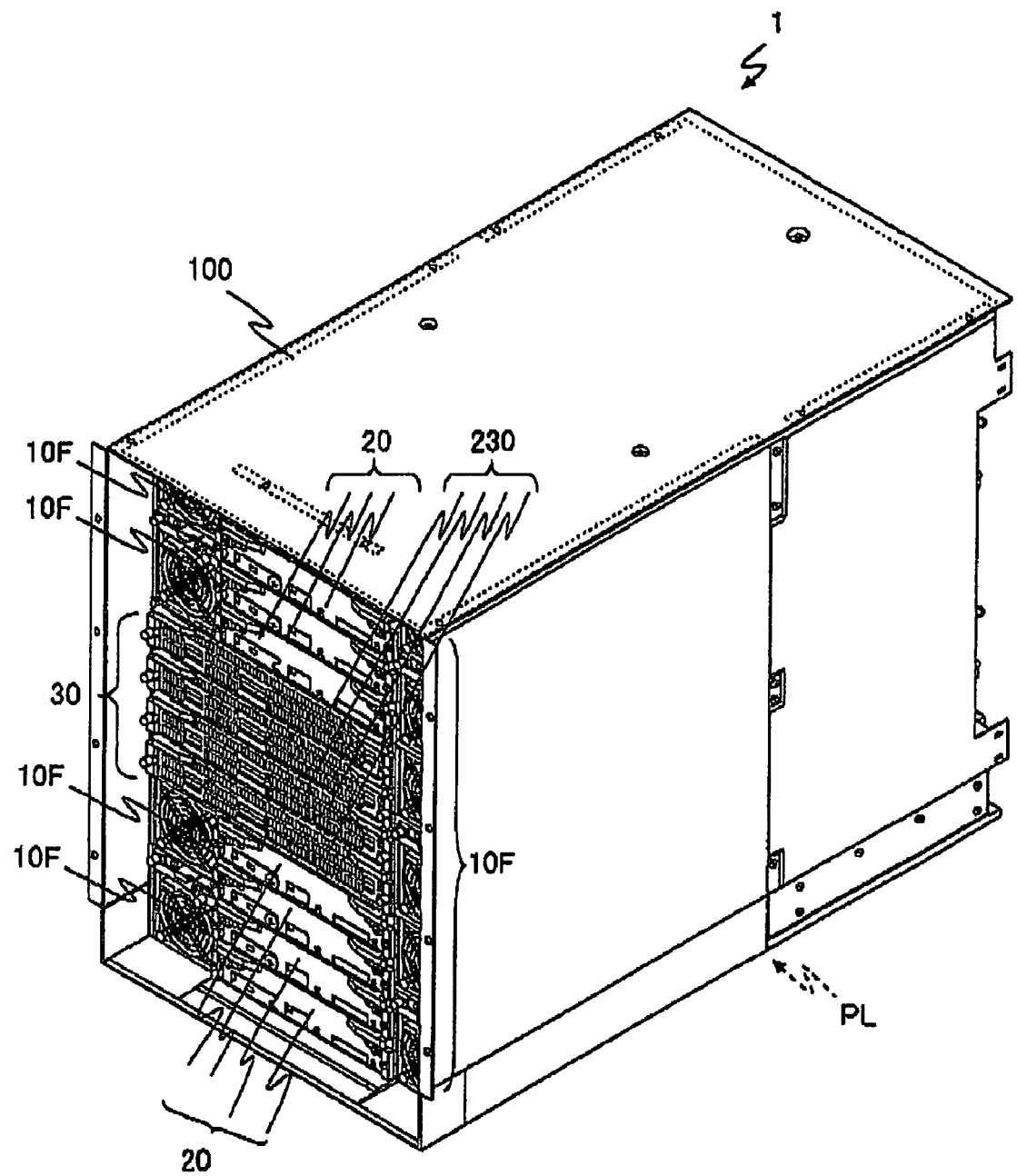

[Fig. 2B]
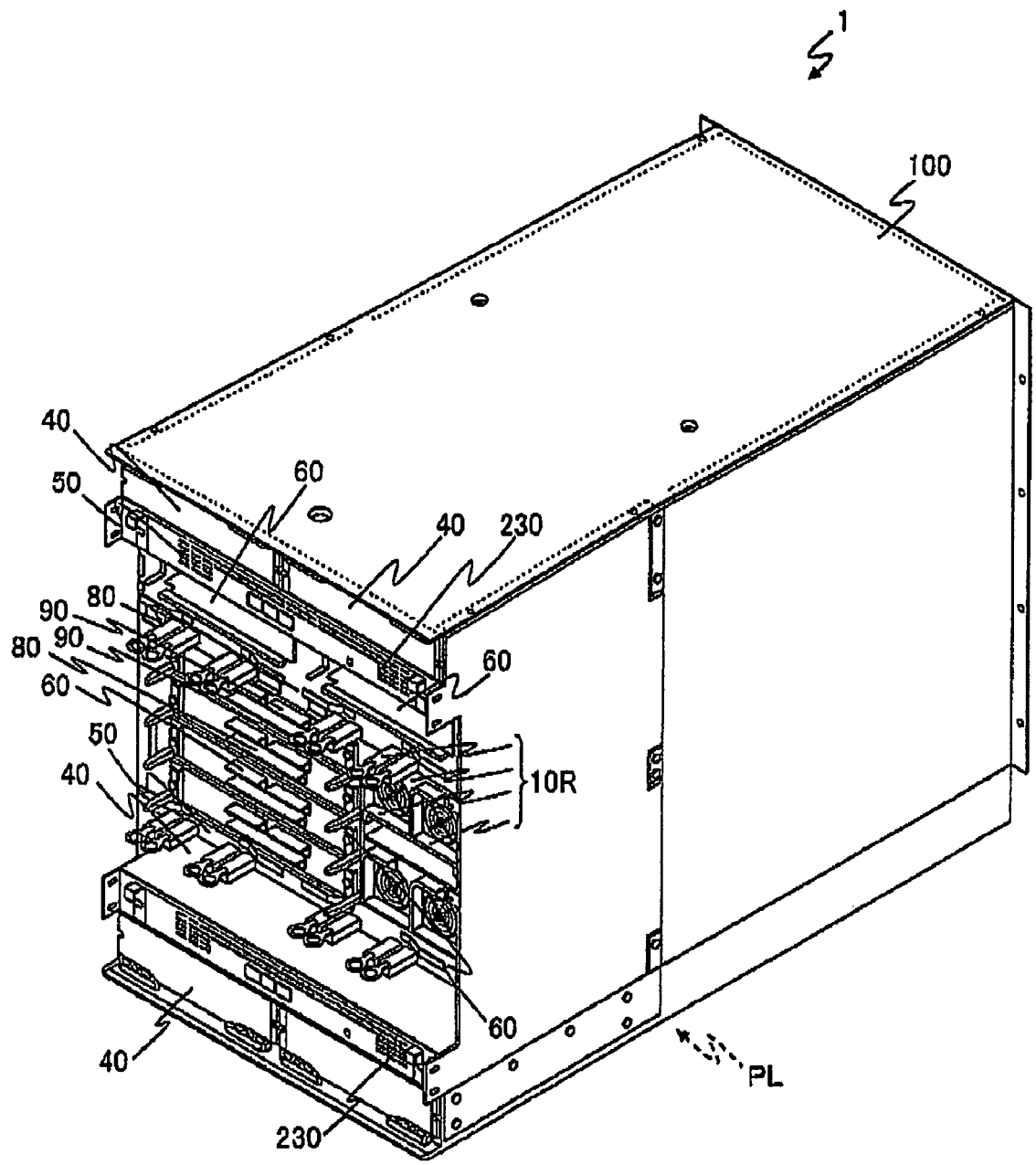

[Fig. 3A]
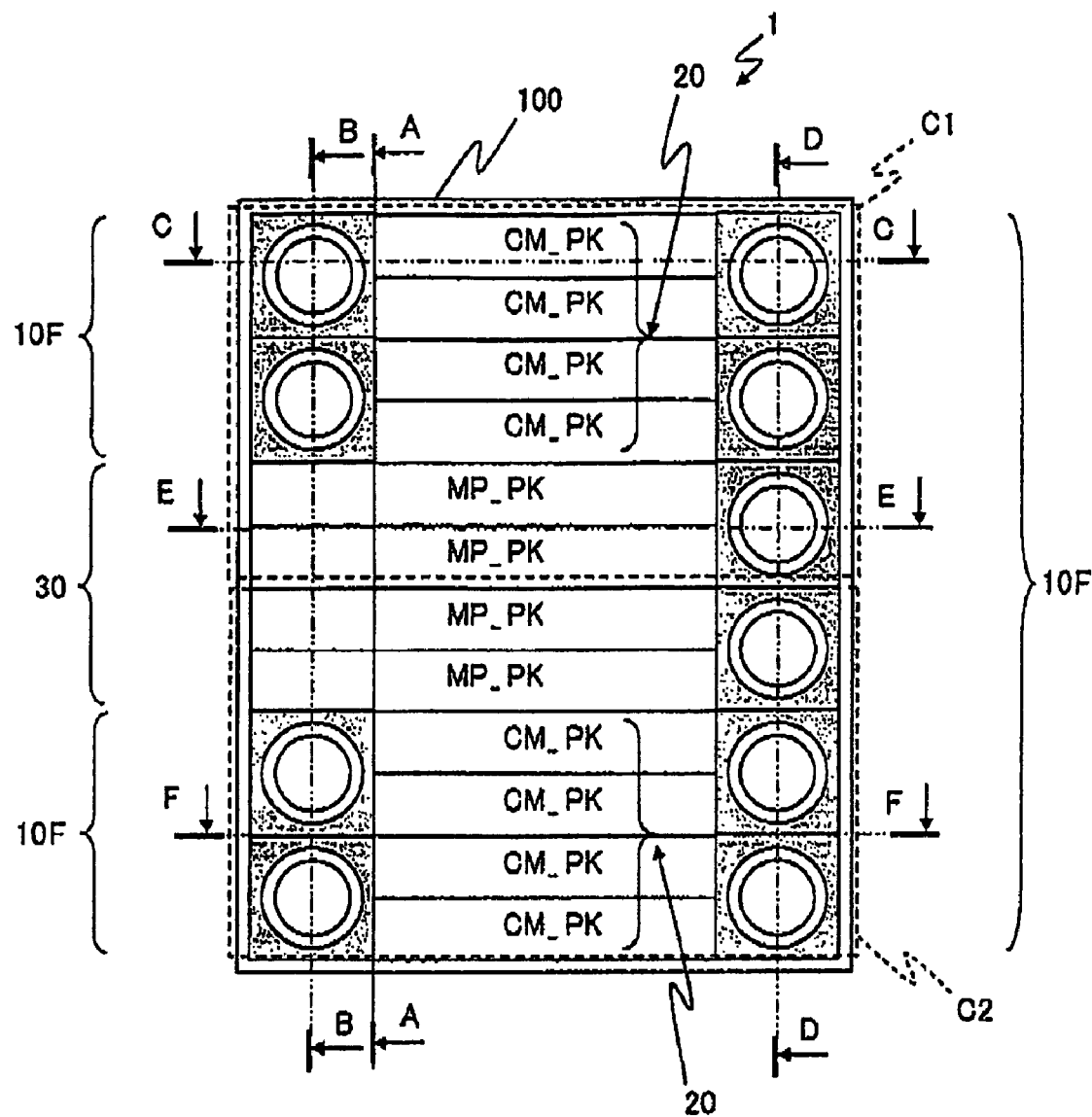

[Fig. 3B]
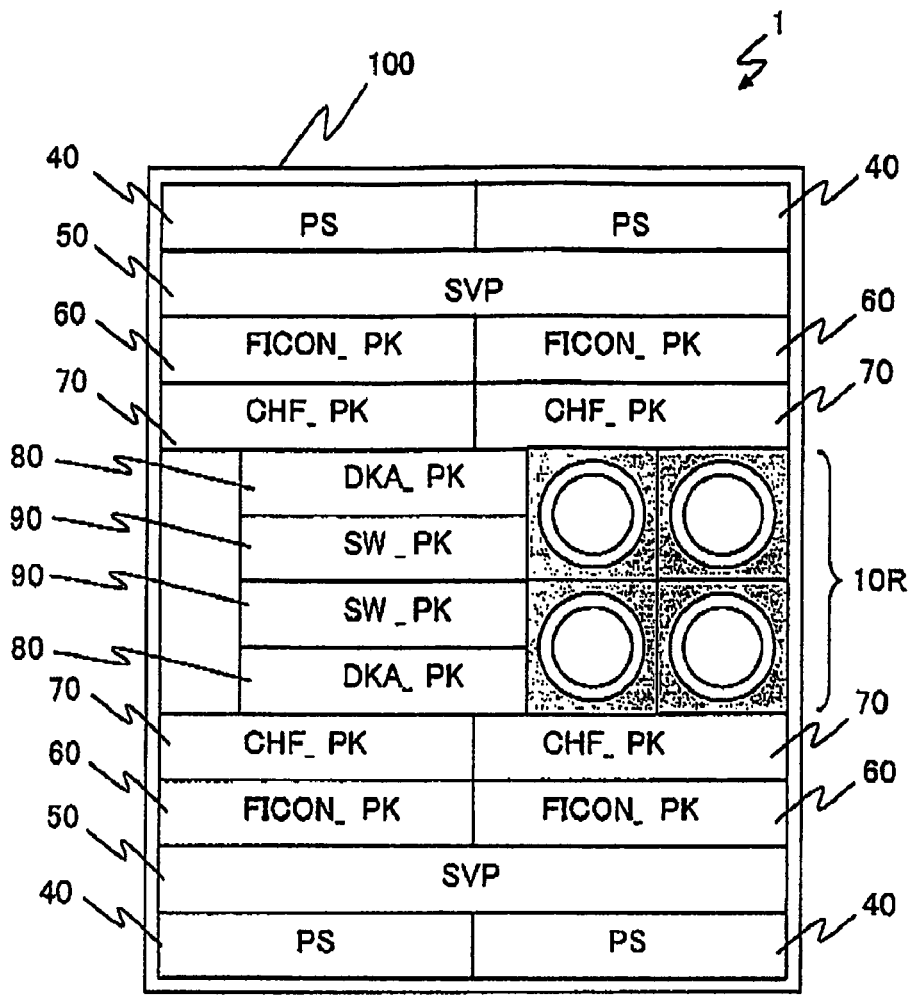
[Fig. 4A]
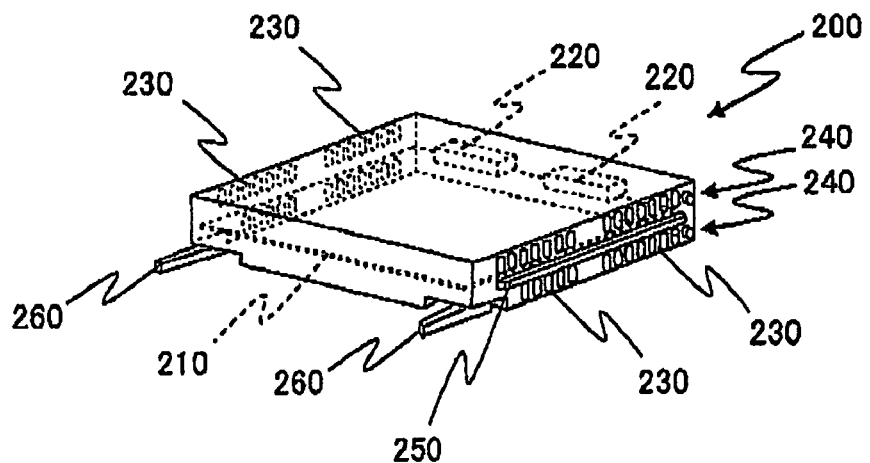

[Fig. 4B]
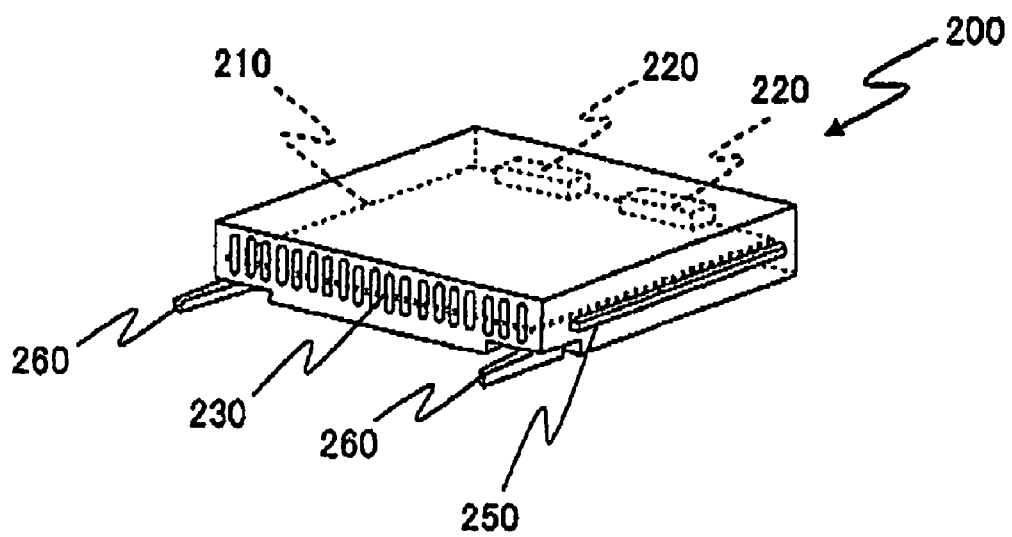

[Fig. 5]
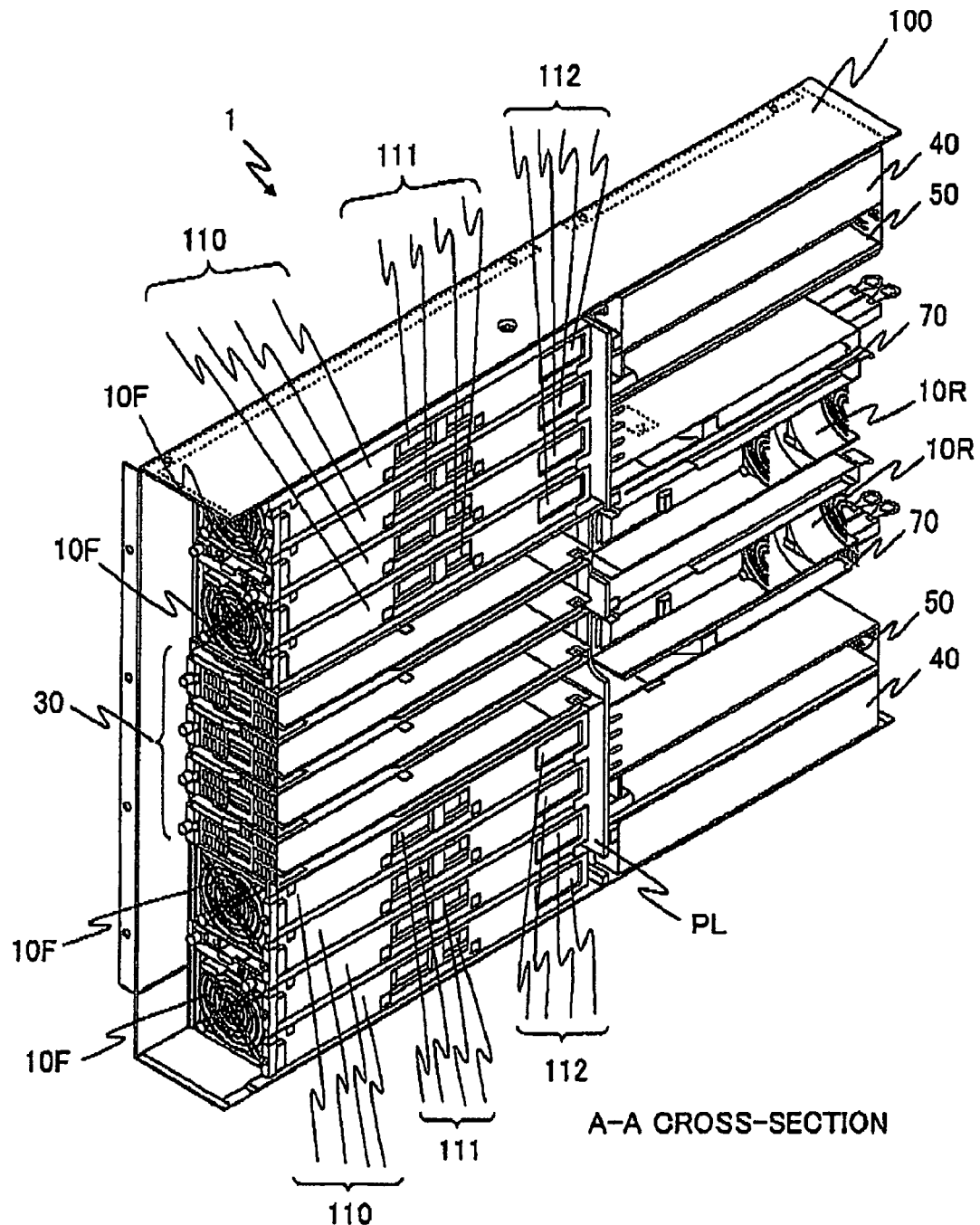
A-A CROSS-SECTION

[Fig. 6]
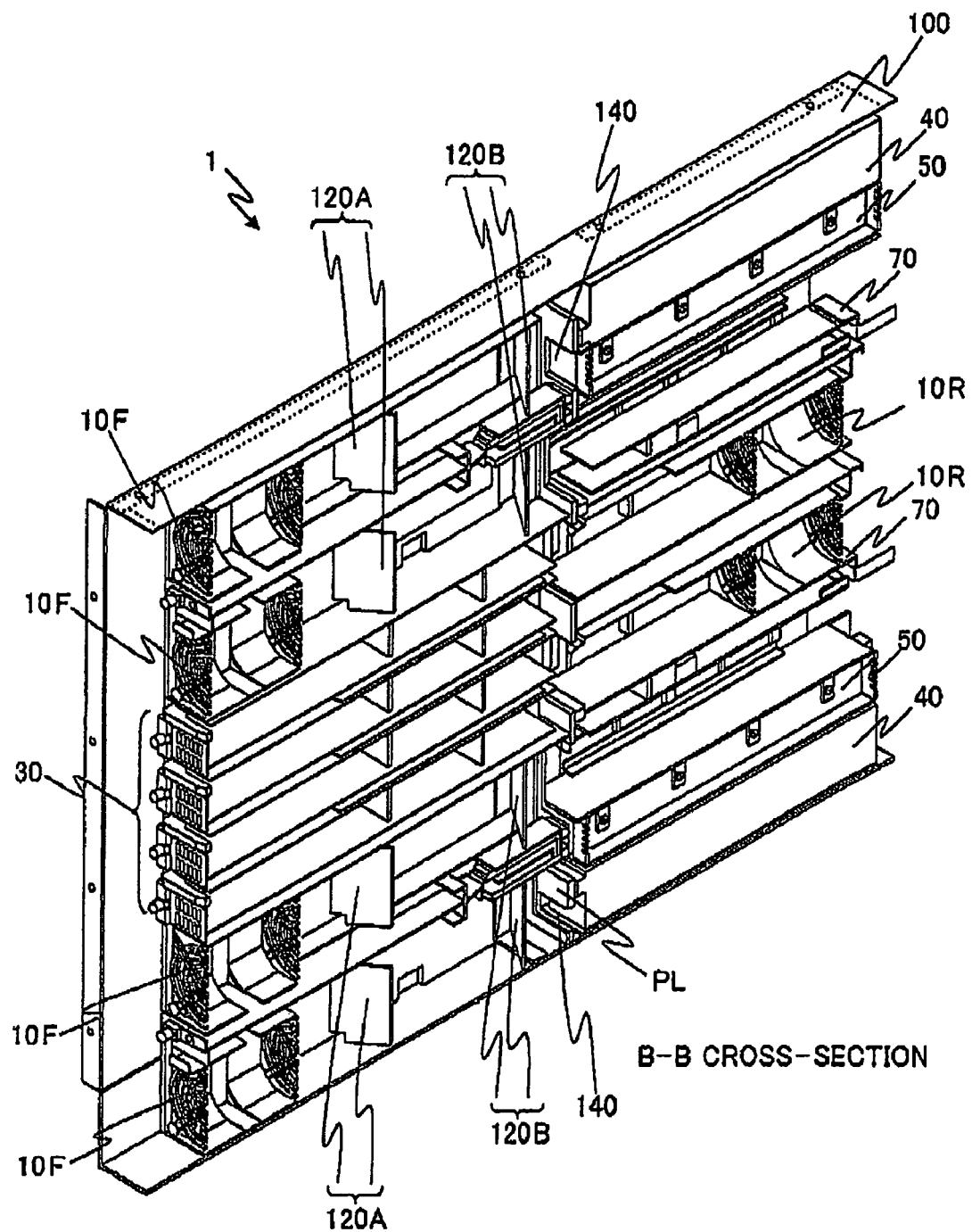
B-B CROSS-SECTION

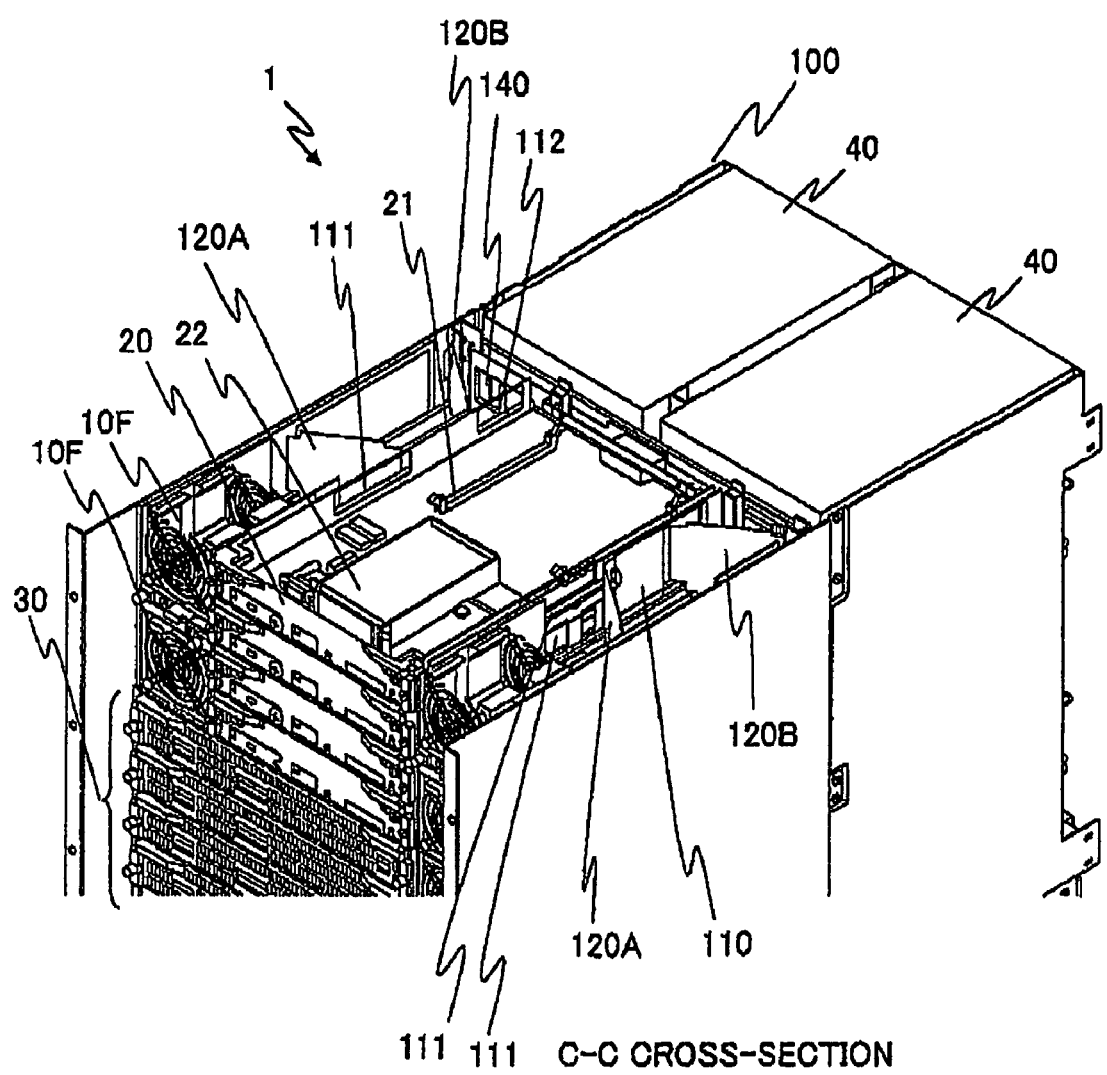
[Fig. 7A]

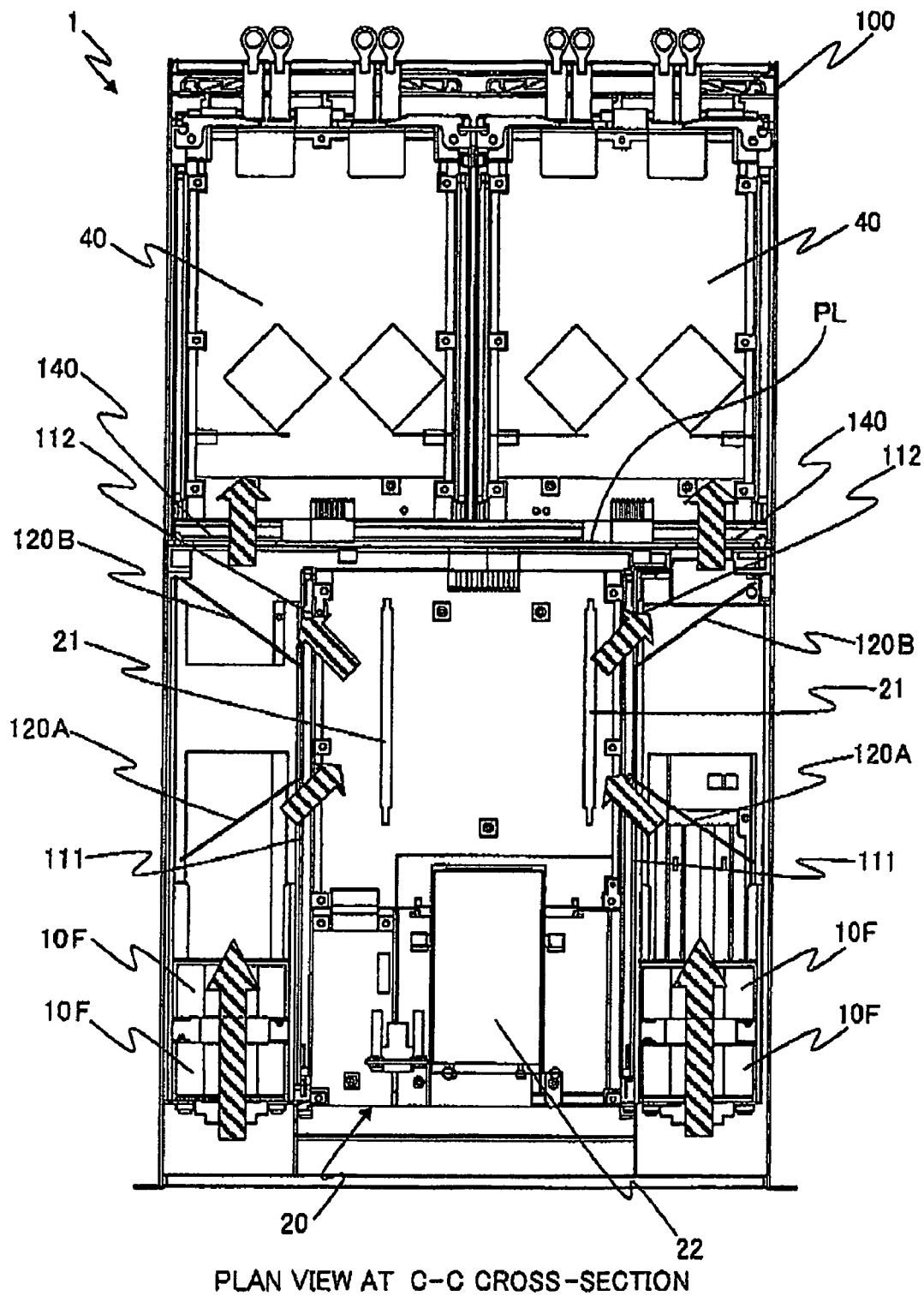
[Fig. 7B]
PLAN VIEW AT C-C CROSS-SECTION

[Fig. 8]
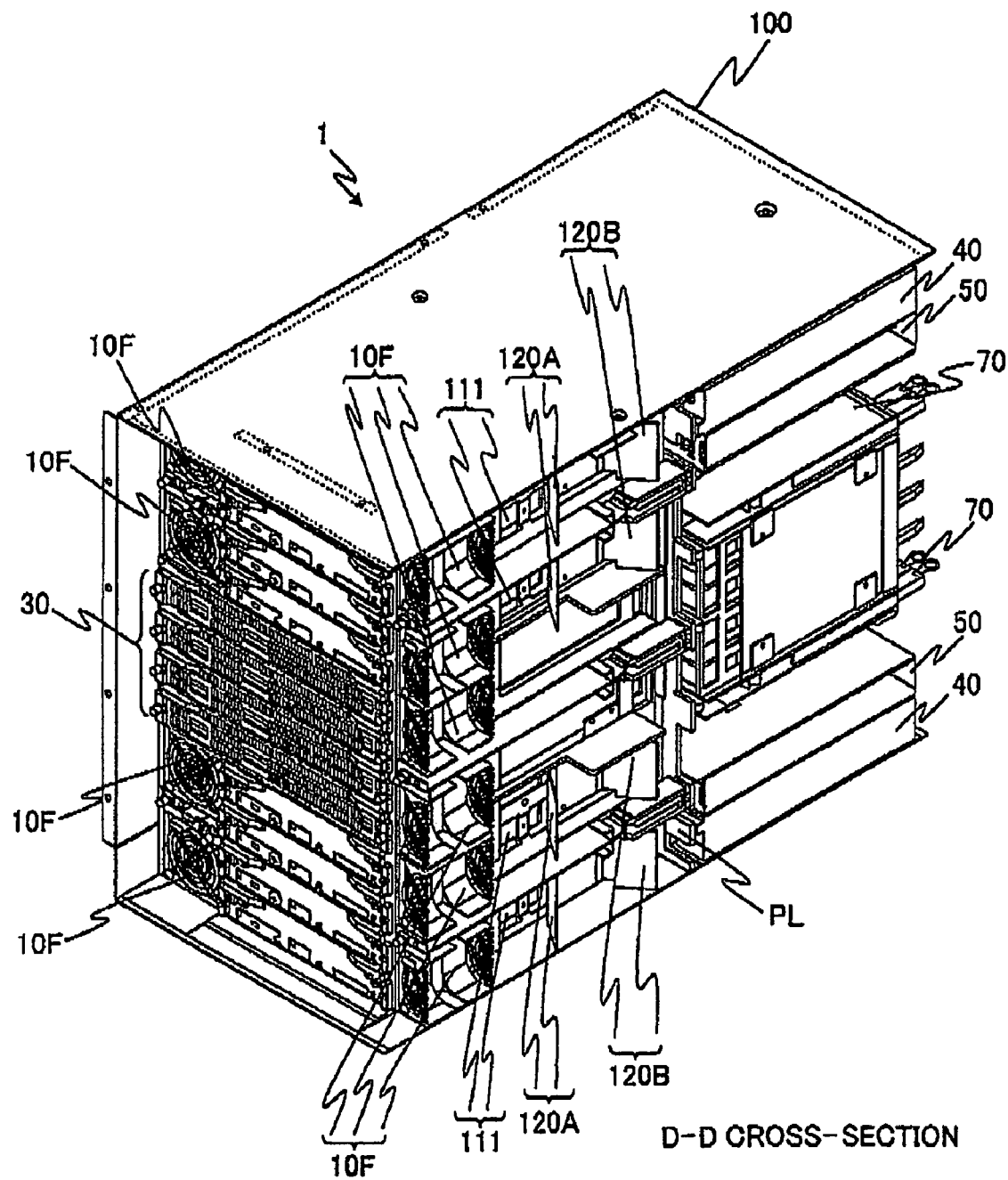
D-D CROSS-SECTION

[Fig. 9A]
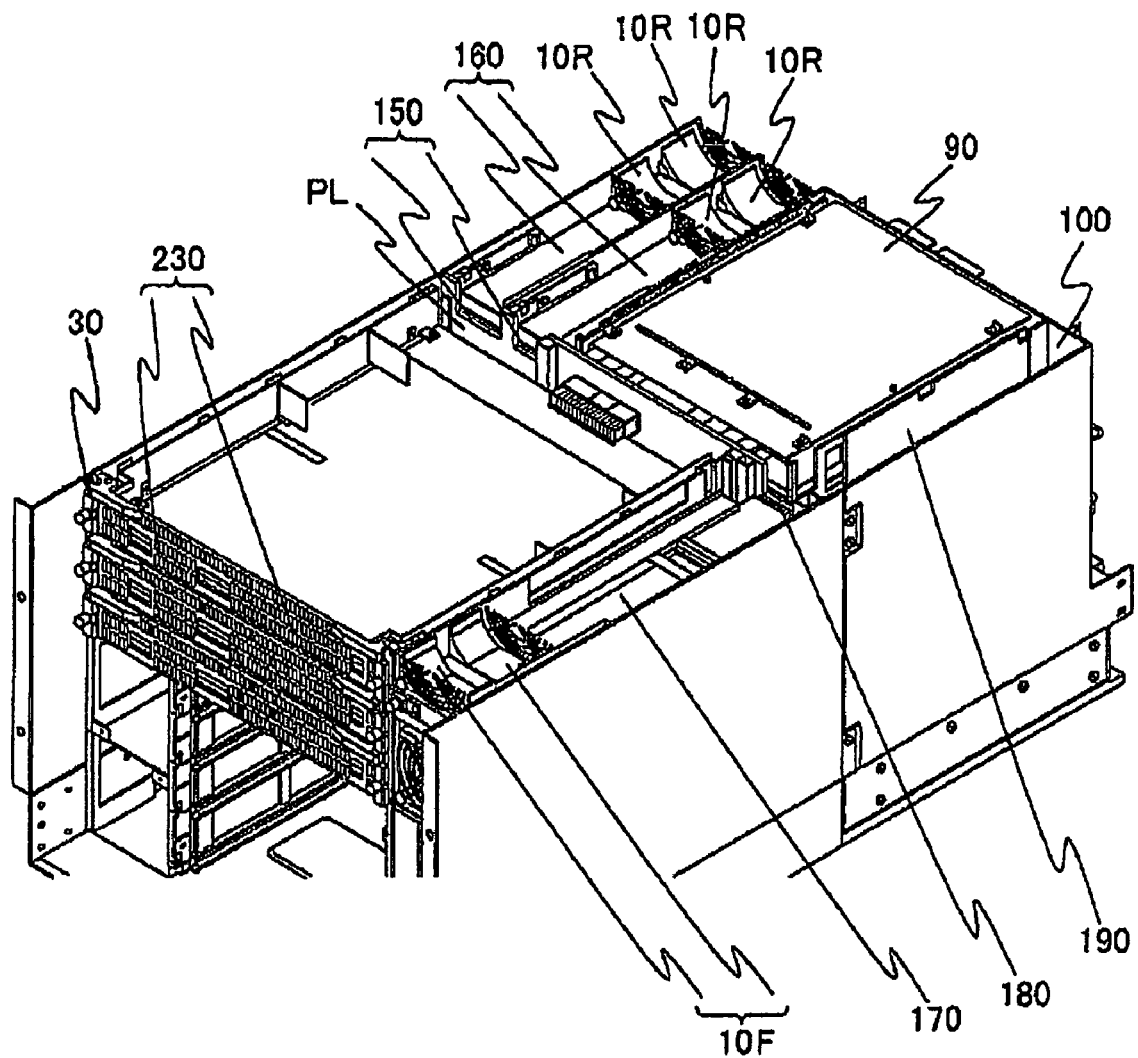
E-E CROSS-SECTION

[Fig. 9B]
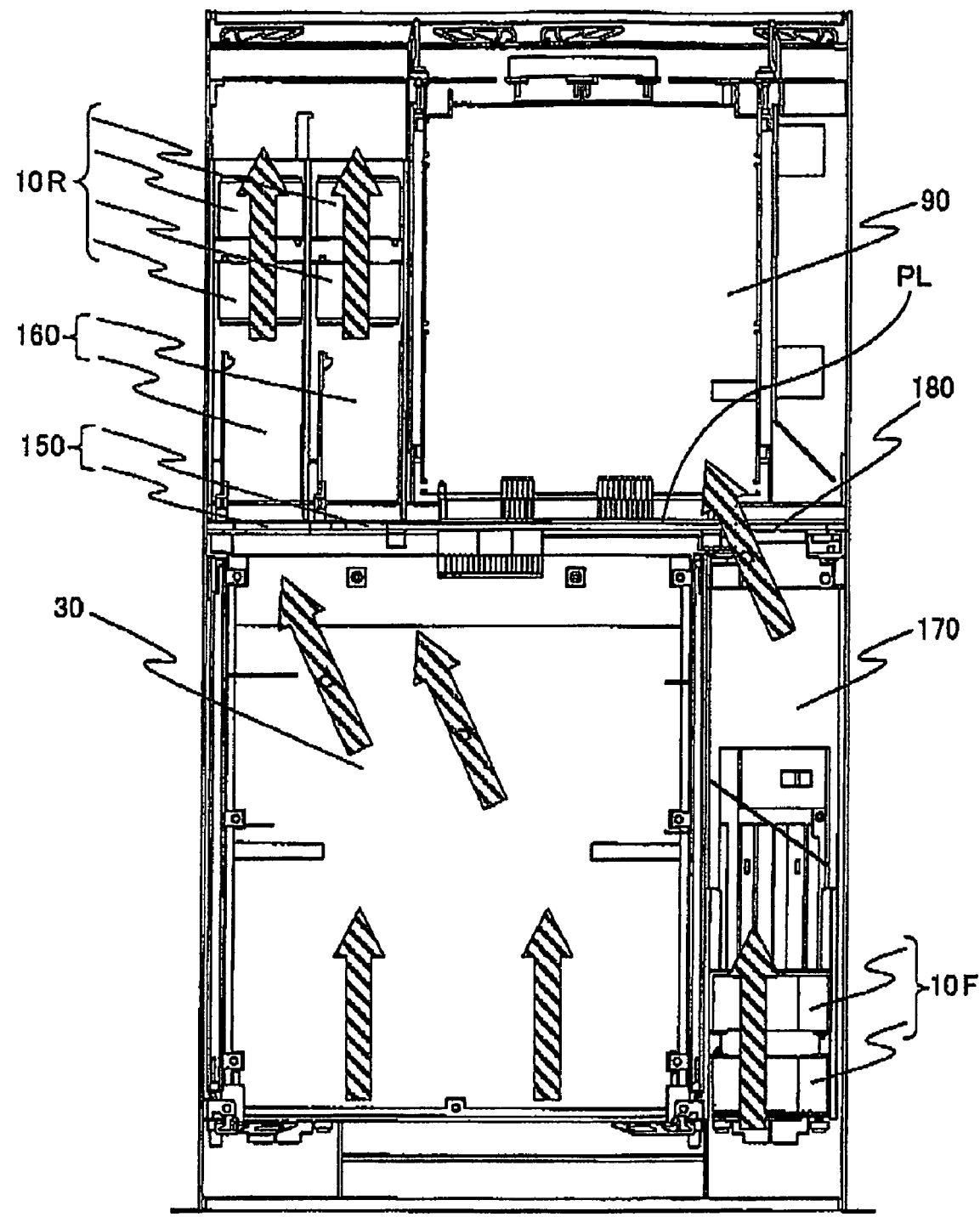
PLAN VIEW AT E-E CROSS-SECTION

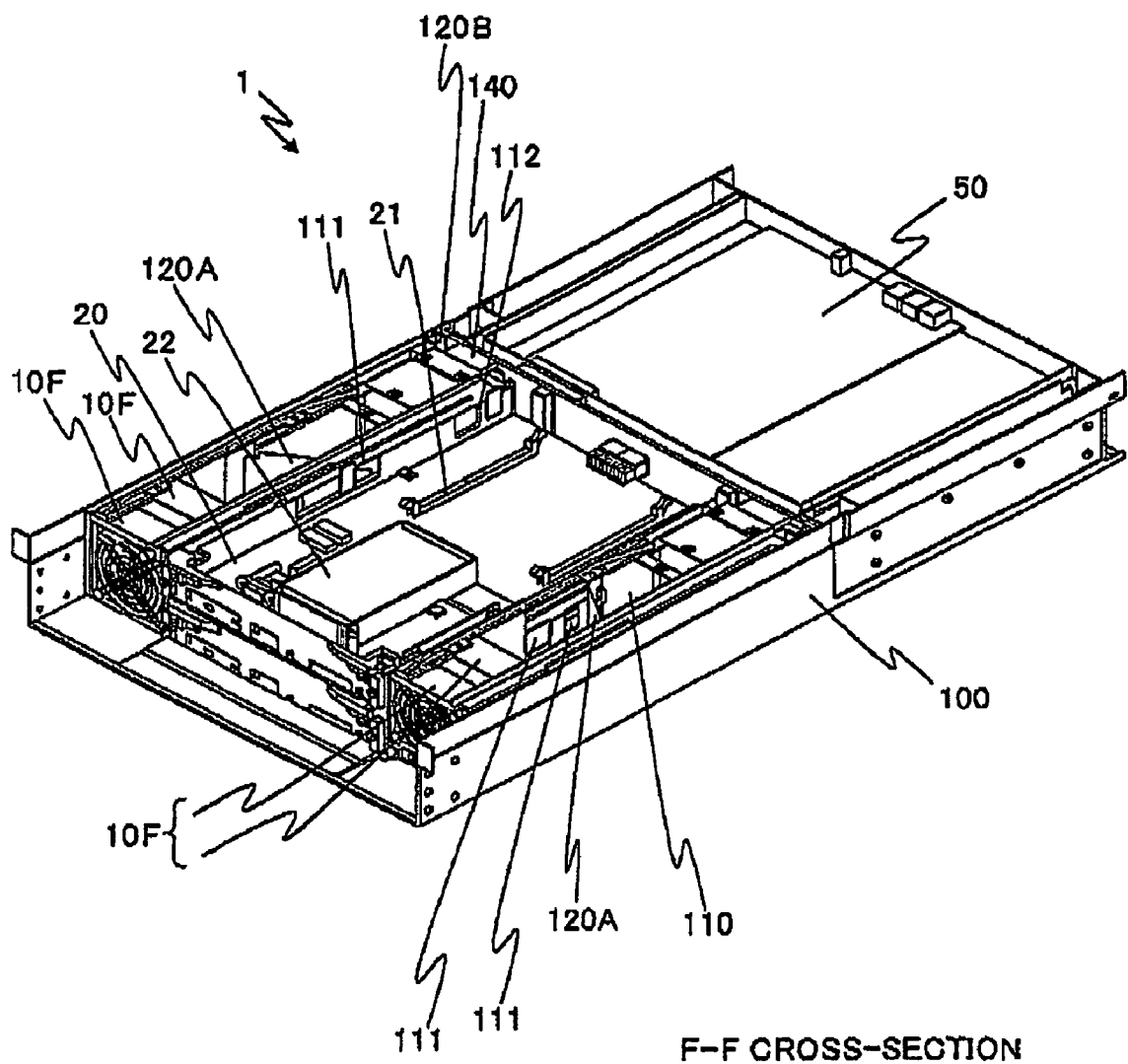
[Fig. 10A]
F-F CROSS-SECTION

[Fig. 10B]
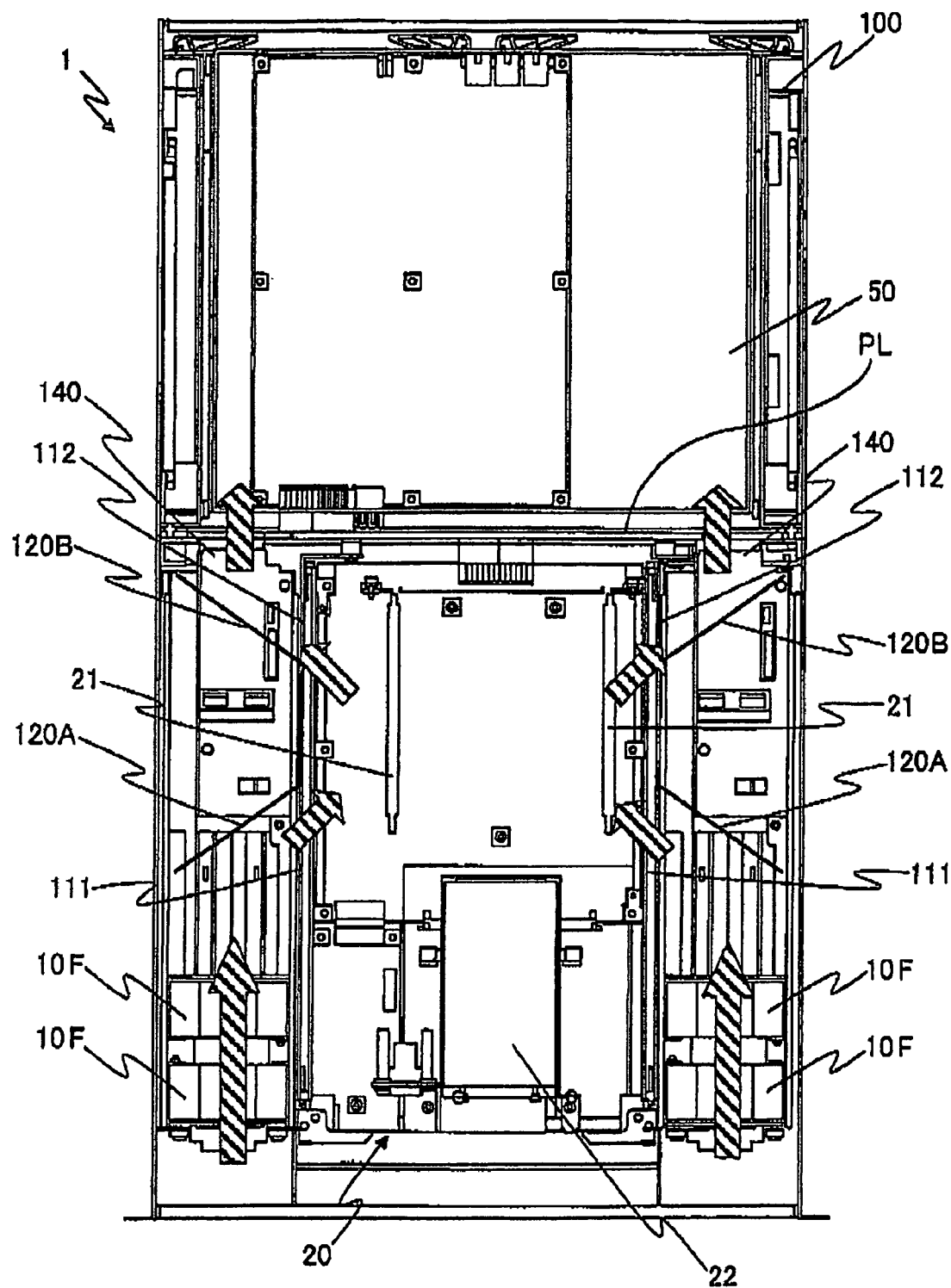
PLAN VIEW AT F-F CROSS-SECTION

[Fig. 11A]
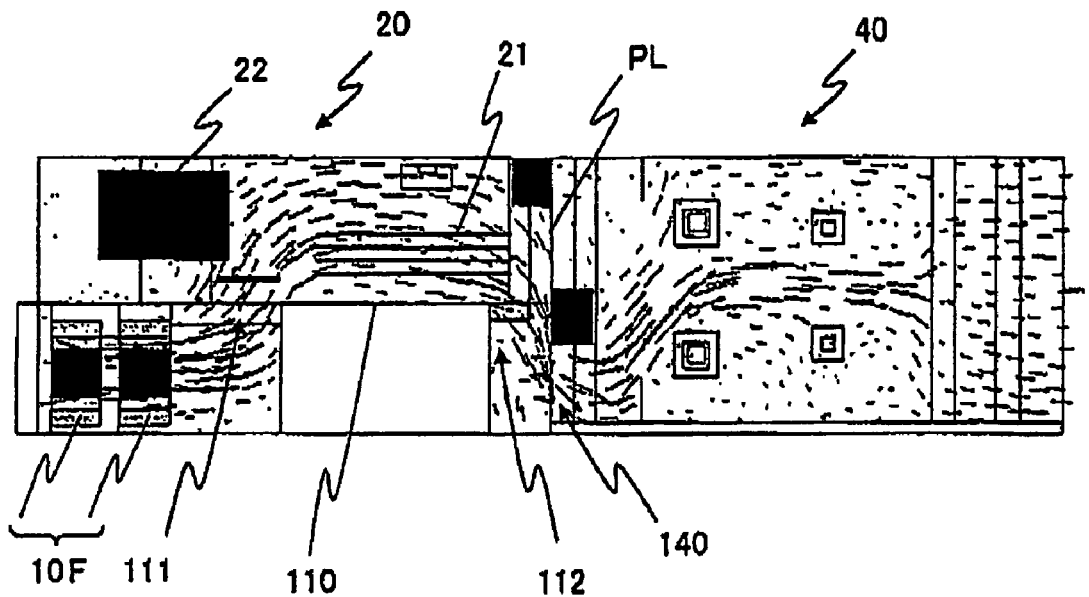
[Fig. 11B]
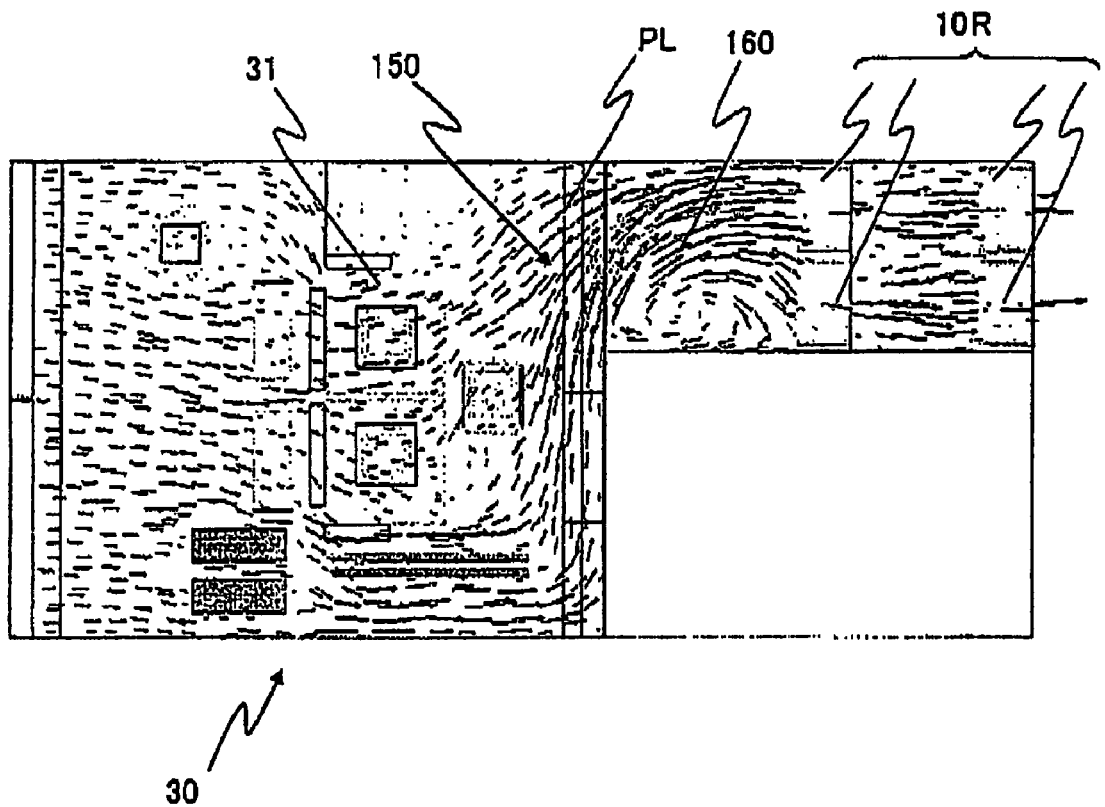

[Fig. 11C]
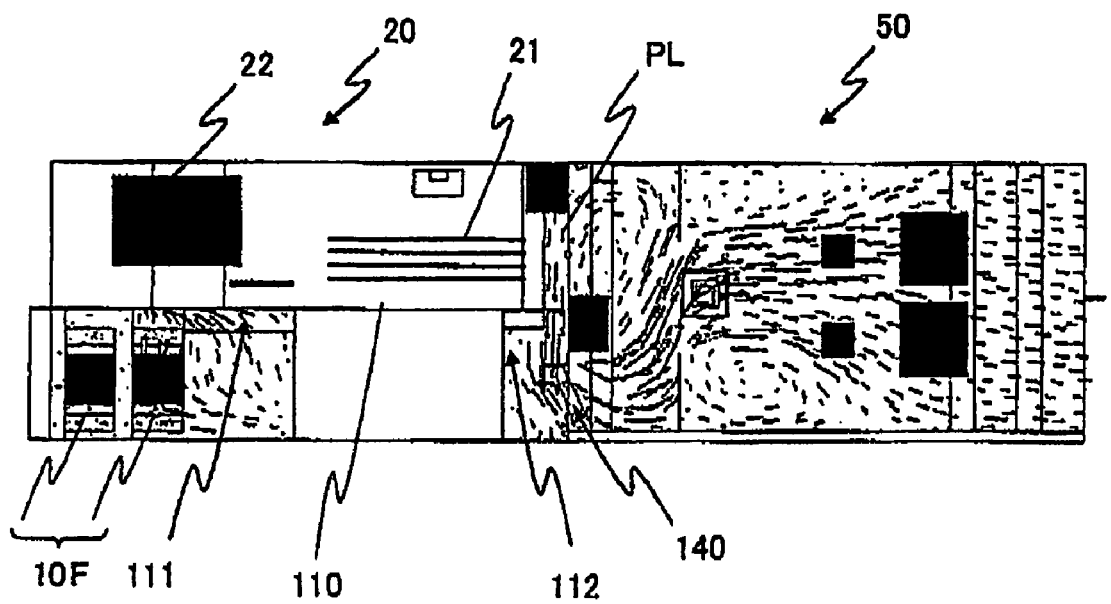
[Fig. 11D]
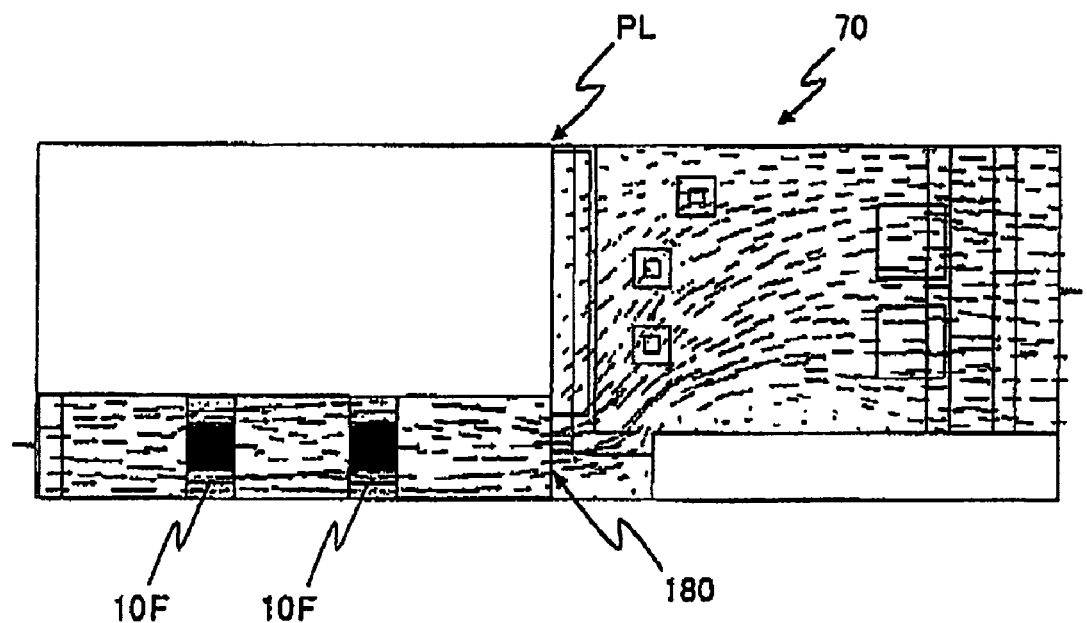

[Fig. 11E]
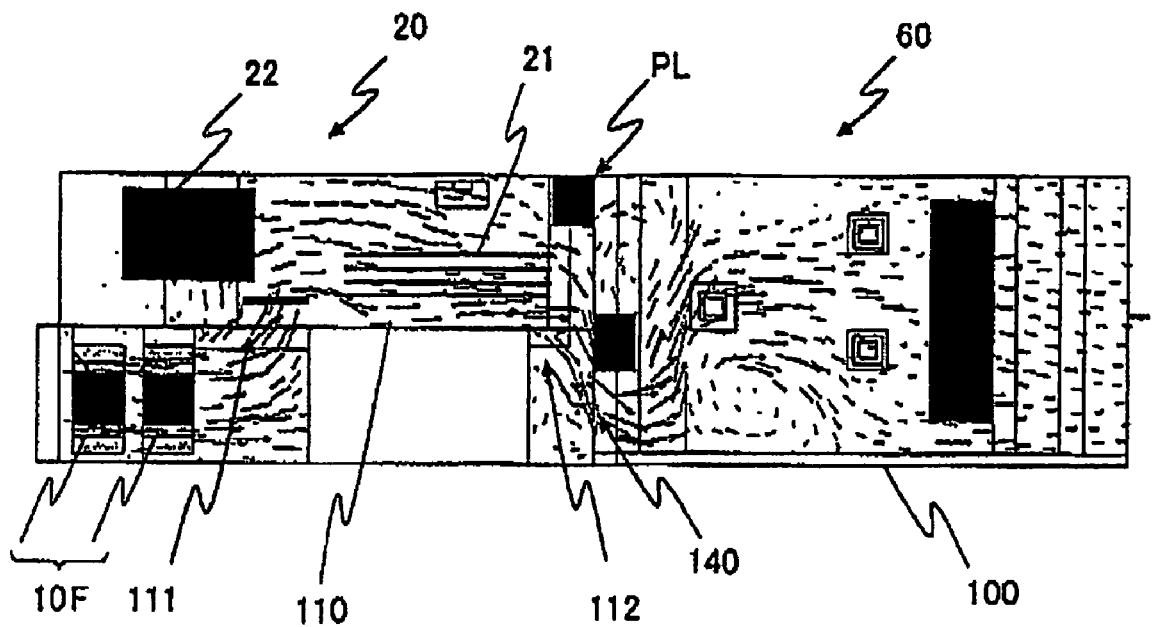

[Fig. 12A]
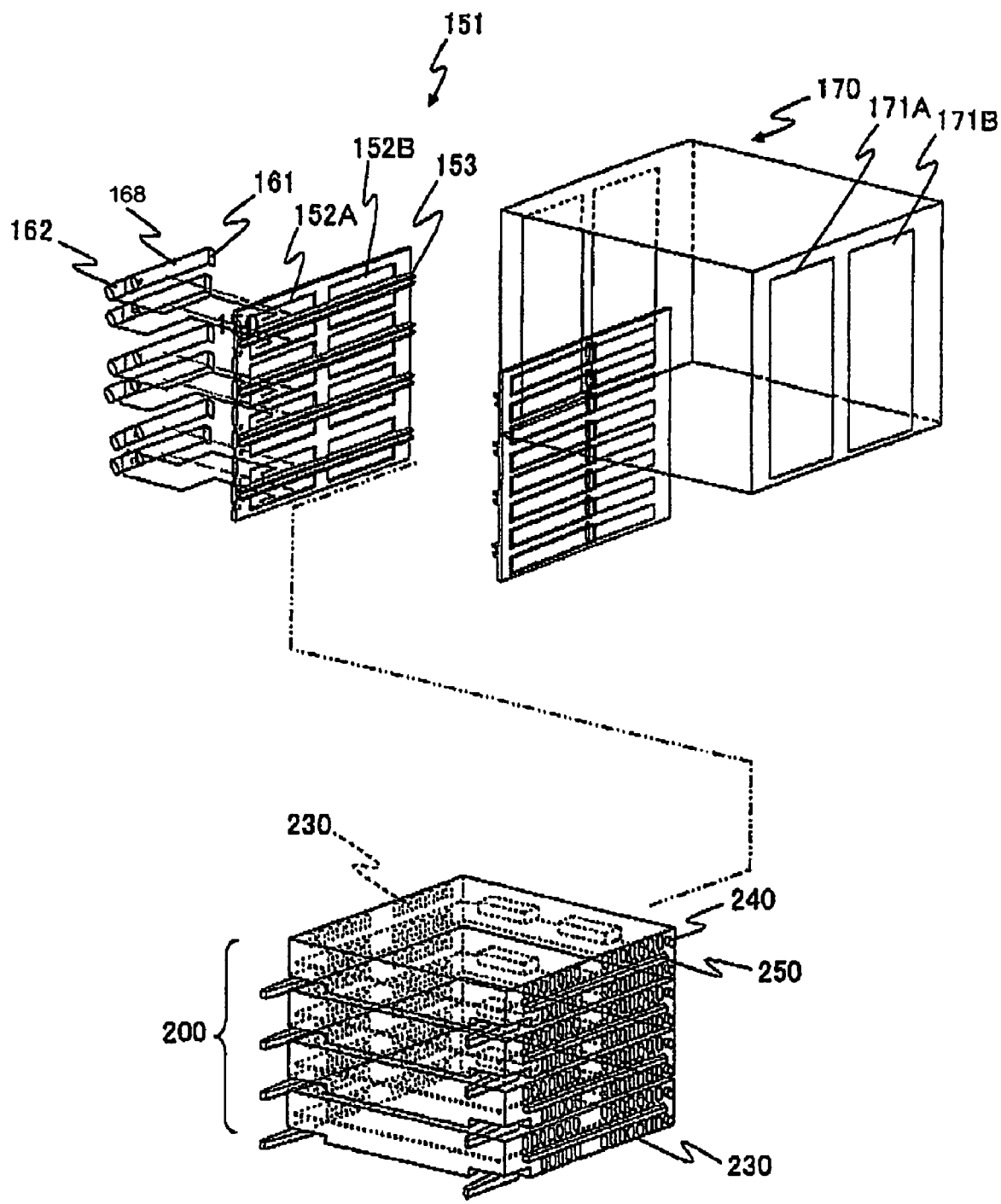

[Fig. 12B]
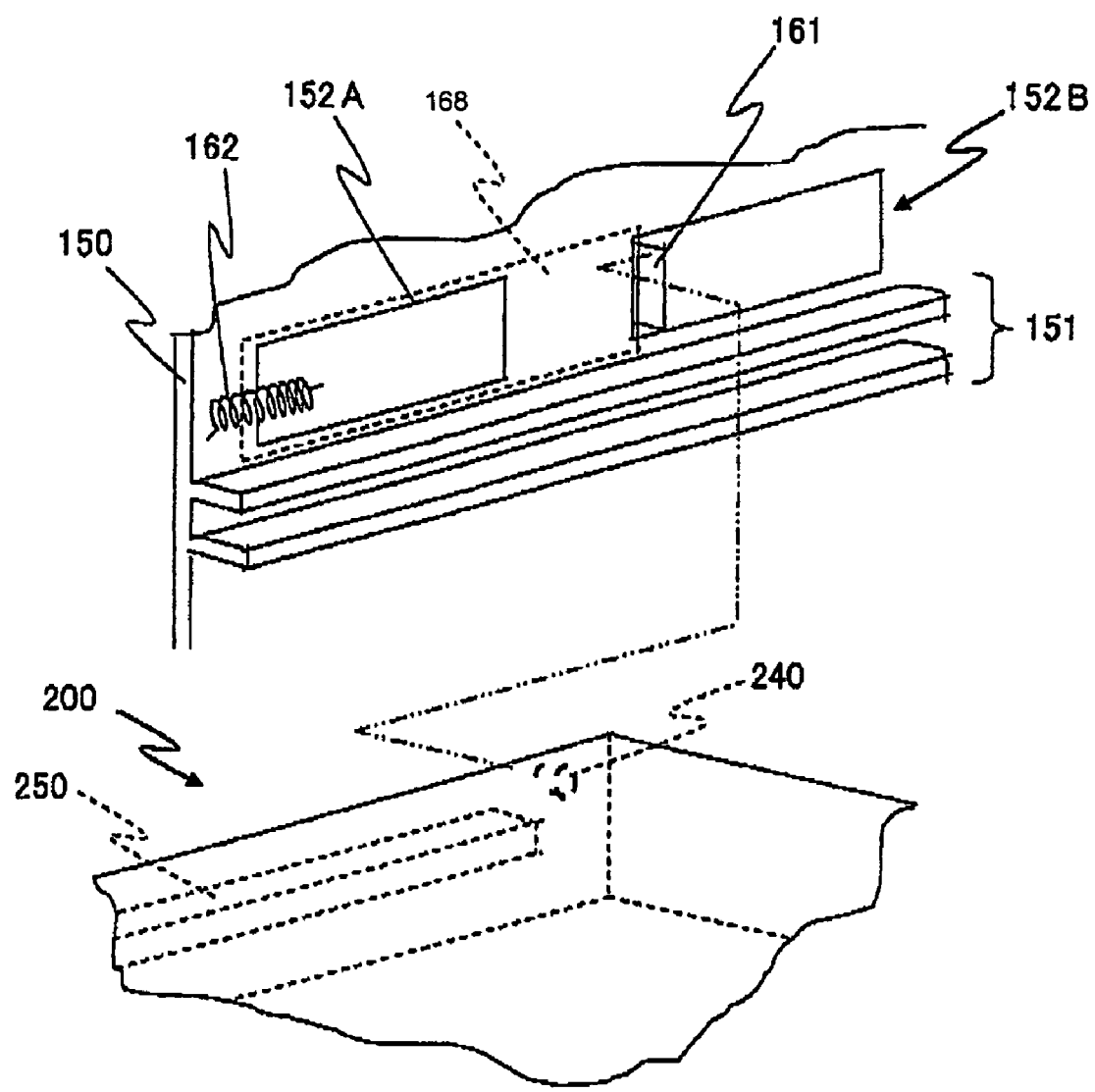

1

STORAGE APPARATUS, STORAGE CONTROLLER FOR STORAGE APPARATUS, CHASSIS FOR STORAGE CONTROLLER

TECHNICAL FIELD

The present invention relates to a storage apparatus, a storage controller for a storage apparatus, and a chassis for a storage controller, and more particularly to a storage apparatus, a storage controller for a storage apparatus, and a chassis for a storage controller that provides efficient cooling of and around heat-generating circuit components disposed on circuit boards.

BACKGROUND ART

A storage apparatus provides data storage areas for an application running on a host computer (hereinafter "host") such as a server computer, and typically includes a plurality of physical storage media and a storage controller creating logical storage areas from a physical storage area of the physical storage media and controlling data I/O processing between the logical storage areas and the host.

Hard disk drives (hereinafter "HDDs") are for example employed as the physical storage media. In order to improve reliability of the stored data, a RAID (Redundant Arrays of Inexpensive (or Independent) Disks) scheme is employed that provides logical storage areas with redundancy.

A storage controller of a storage apparatus has, for example, for implementing the above data I/O processing, a plurality of circuit boards storing a processor for executing various control programs, a memory device for storing various data and programs, communication interfaces for providing communication with an external network and the like, a power supply for supplying electric power to various parts of the controller, and so on. In recent years, demand for increases in data storage capacity, upgrading of data I/O processing, and the like have resulted in high-density mounting of circuit components on the circuit boards, an increase in the number of the circuit boards to be stored in the controller, employment of a high speed microprocessor, and so on. Accordingly, heat amount generated from the circuit boards stored in the storage controller continues to increase, and efficient cooling of the circuit boards and the components mounted thereon is strongly demanded.

From this point of view, PTL 1 illustrates a cooling structure of a rack mount type storage controlling apparatus that provides efficient cooling of an inner space of a chassis in which, at a front side and a rear side of a connecting board thereof, a group of control boards and power supply devices are respectively installed in high density.

CITATION LIST

Patent Literature

PTL 1: Japanese Patent Application Laid-open Publication No. 2009-53978

SUMMARY OF INVENTION

Technical Problem

According to the configuration proposed in PTL 1, as shown in FIG. 1, for example, a cooling air flow path of substantially U-letter shape is formed between the control boards vertically mounted in the chassis. In this configuration, as is apparent from the figure, four bending portions exist along the flow path in which portion the flow path is bent substantially at a right angle, the portions causing an increase in flow resistance for cooling air when circulating therealong, thus making it difficult to secure sufficient cooling efficiency.

The present invention was made to solve the above and other problems and one object thereof is to provide a storage apparatus, a storage controller for a storage apparatus, and a chassis for a storage controller that enables efficient cooling of and around heat-generating circuit components disposed on circuit boards.

Solution to Problem

In order to accomplish the above and other objects, one aspect of the present invention is a storage apparatus providing a logical storage area as a data storage area for an external apparatus, comprising physical storage media for creating the logical storage area, and a storage controller communicatively coupled with the physical storage media for controlling data I/O processing between the external apparatus and the physical storage media, wherein the storage controller includes a plurality of circuit board modules each having a circuit board implementing a predetermined function of the storage controller, and a circuit board case storing the circuit board, and a chassis having a hollow cylindrical container with a front side opening and a rear side opening, configured to store the plurality of circuit board modules from the front and rear side openings, wherein the plurality of circuit board modules include a first circuit board module to be inserted from the front side opening, configured to introduce cooling air through an opening provided on at least one side surface of the circuit board case toward a circuit component mounted on the circuit board, a second circuit board module to be inserted from the rear side opening of the chassis, configured to introduce cooling air through an opening provide on a front surface of the circuit board case toward the circuit component mounted on the circuit board, wherein the storage controller further includes a first fan arranged adjacent to the first circuit board module from the front side opening of the chassis, supplying cooling air through the opening provided on the side surface of the first circuit board module, and a second fan positioned at the rear side of the second circuit board module from the rear side opening of the chassis, configured to introduce cooling air through the opening at the front side surface of the second circuit board module by suction of air out of the second circuit board module.

Another aspect of the present invention is a storage controller for a storage apparatus, the storage apparatus including physical storage media for creating a logical storage area to be used as a data storage area for an external apparatus, the storage controller communicatively coupled with the physical storage media for controlling data I/O processing between the external apparatus and the logical storage area, the storage controller comprising a plurality of circuit board modules each having a circuit board implementing a predetermined function of the storage controller, and a circuit board case storing the circuit board, and a chassis having a hollow cylindrical container with a front side opening and a rear side opening, configured to store the plurality of circuit board modules from the front and rear side openings, the plurality of circuit board modules including a first circuit board module to be inserted from the front side opening, configured to introduce cooling air through an opening provided on at least one side surface of the circuit board case toward a circuit component mounted on the circuit board, and a second circuit board module to be inserted from the rear side opening of the chassis, configured to introduce cooling air through an opening provide on a front surface of the circuit board case toward the circuit component mounted on the circuit board, a first fan arranged adjacent to the first circuit board module from the front side opening of the chassis, supplying cooling air through the opening provided on the side surface of the first circuit board module, and a second fan positioned at the rear side of the second circuit board module from the rear side opening of the chassis, configured to introduce cooling air through the opening at the front side surface of the second circuit board module by suction of air out of the second circuit board module.

A further aspect of the present invention is a chassis for the above storage controller, wherein the opening provided on the side surface of the circuit board case of the circuit board module includes a first aperture and a second aperture, the first aperture positioned at a proximal part of the side surface when the first circuit board module is stored in the chassis, the second aperture positioned at a distal part of the side surface when the first circuit board module is stored in the chassis, wherein the chassis is provided with an opening and closing mechanism to selectively put the first aperture or the second aperture in an opened condition or a closed condition, wherein the opening and closing mechanism is disposed in the chassis at a position opposite the first aperture and the second aperture of the circuit board case of the first circuit board module, wherein the opening and closing mechanism has a shutter member selectively opening or closing the first aperture or the second aperture when the first circuit board module is installed in the chassis, wherein the shutter member provided with the chassis is positioned to close the first aperture of the first circuit board module at an initial state, wherein an engaging part configured to engage the shutter member is provided to at lease one side surface of the circuit board case constituting the first circuit board module, wherein the engaging part moves the shutter member to a position where the shutter member closes the second aperture when the first circuit board module is inserted in the chassis.

Advantageous Effects of Invention

According to the present invention, a storage apparatus, a storage controller for a storage apparatus, and a chassis for a storage controller that provides efficient cooling of and around heat-generating circuit components disposed on circuit boards can be provided.

BRIEF DESCRIPTION OF DRAWINGS

FIG. 1A shows an example of a configuration of a storage system SS according to one embodiment of the present invention.

FIG. 1B shows an example of an external view of a storage apparatus S according to an embodiment of the present invention.

FIG. 2A shows a perspective view of a disk controller 1 of the storage apparatus S as seen from a front side thereof.

FIG. 2B shows a perspective view of a disk controller in FIG. 2A as seen from a rear side thereof.

FIG. 3A shows a schematic elevational view of a disk controller 1 as seen from a front side thereof.

FIG. 3B shows a schematic elevational view of a disk controller 1 as seen from a rear side thereof.

FIG. 4A shows a schematic view of an example of a circuit board module 200 installed in the disk controller 1.

FIG. 4B shows a schematic view of another example of a circuit board module 200 installed in the disk controller 1.

FIG. 5 shows a cross-sectional view of the disk controller 1 at A-A cross-section.

FIG. 6 shows a cross-sectional view of the disk controller 1 at B-B cross-section.

FIG. 7A shows a cross-sectional view of the disk controller 1 at C-C cross-section.

FIG. 7B shows a cross-sectional plan view of the disk controller 1 at C-C cross-section.

FIG. 8 shows a cross-sectional view of the disk controller 1 at D-D cross-section.

FIG. 9A shows a cross-sectional view of the disk controller 1 at E-E cross-section.

FIG. 9B shows a cross-sectional plan view of the disk controller 1 at E-E cross-section.

FIG. 10A shows a cross-sectional view of the disk controller 1 at F-F cross-section.

FIG. 10B shows a cross-sectional plan view of the disk controller 1 at F-F cross-section.

FIG. 11A shows a result of simulation of a flow of cooling air in a CM module 20.

FIG. 11B shows a result of simulation of a flow of cooling air in an MP module 30.

FIG. 11C shows a result of simulation of a flow of cooling air in the CM module 20 and an SVP 50.

FIG. 11D shows a result of simulation of a flow of cooling air in a CHF module 70.

FIG. 11E shows a result of simulation of a flow of cooling air in a CM module 20 and a FICON module 60.

FIG. 12A shows a schematic view of an example of a controllable structure of a cooling air inlet in the disk controller 1 according to the present embodiment.

FIG. 12B shows a detailed schematic view of an example of a controllable structure of a cooling air inlet in the disk controller 1 according to the present embodiment.

DESCRIPTION OF EMBODIMENTS

Now an embodiment of the present invention will be described hereinbelow referring to the attached drawings. It is to be noted identical reference symbols are allotted to identical elements through the figures and redundant explanation thereof omitted.

Basic Configuration of Storage System SS

First, as a basis for description of a rack mount type storage apparatus S and a disk controller 1 (storage controller) of the same, a basic configuration of a storage system SS will be given. FIG. 1A shows an exemplary basic configuration of the storage system SS.

The storage system SS comprises a host H and a storage apparatus S. The host H and the storage apparatus S are coupled by a communication network N. While 3 hosts H and a single storage apparatus S are illustrated in FIG. 1A, the number of the host H may be less than 3 or 4 or more, and a plurality of storage apparatuses S may be disposed.

The host H is a computer such as a server computer that is installed with an operating system (hereinafter "OS") as appropriately chosen, such as Windows (registered trademark) and Linux (registered trademark), and a variety of application software that runs on the OS. The host H is provided with a communication interface providing a connection interface with the communication network N, such as for example a host bus adaptor (hereinafter "HBA") and a network interface card (hereinafter "NIC"), and can communicate with the storage apparatus S to be described later. According to the above, the applications running on the host H can use storage areas provided by the storage apparatus S for data storage.

The communication network N is a communication line used for data transmission between the host H and the storage apparatus S, and can be configured, for example, as a SAN (Storage Area Network) connected with a Fibre Channel (hereinafter "FC") protocol, or a LAN (Local Area Network) connected with a TCP/IP (Transmission Protocol/Internet Protocol). The communication network N includes switches for controlling data transmission paths between the host H and the storage apparatus 5, such as an FC switch when implemented as a SAN and routers when implemented as a LAN. It is to be noted that although the following description assumes that the communication network N is configured as a SAN, the kind of communication network N does not restrict the configuration of the disk controller 1 of the present embodiment Storage Apparatus S Next, also referring to FIG. 1A, the configuration of the storage apparatus S will be described. The storage apparatus S in general comprises a disk controller 1 and a disk unit 2. The disk controller 1 and the disk unit 2 are coupled by an internal communication network.

The disk unit 2 includes a plurality of HDDs 3 as physical storage media, for example, and provides logical storage areas with redundancy typically by controlling the HDDs 3 using RAID. Instead of the HDDs 3, other appropriate storage media such as an SSD (Solid State Drive), an optical disk device like a DVD (Digital Versatile Disk) device, and a magnetic tape device may be employed as physical storage media.

The disk controller 1 mainly performs respective functions of communication control/data I/O control in connection with the host H through the communication network N, and data I/O control in connection with the disk unit 2 through the internal communication network.

In order to implement the above functions, the disk controller 1 comprises a cache memory (hereinafter "CM") module 20, a microprocessor (hereinafter "MP") module 30, a power supply (hereinafter "PS") module 40, a service processor (hereinafter "SVP") module 50, FICON (Fibre CONnection, registered trademark) module 60, a CHF module 70, DKA (DisK Adaptor) module 80, and a SW module 90.

The above modules 20-90 each have a circuit board on which circuits relating to each unit functional block are provided for implementing all the functions of the disk controller 1, and a circuit board case (hereinafter "case") for storing the circuit board. The circuit board is provided with a connector for electrically connecting an inner circuit of the same with an external circuit. A mechanical structure of the respective modules 20-90 will be described later.

The disk controller 1 in FIG. 1A employs a redundant configuration in which a pair of groups each including the modules 20-90 are provided (each group is herein referred to as a "cluster"). The disk controller 1 is configured to perform mutual monitoring of operating conditions of the clusters, for example, through a data communication line arranged between the clusters (not shown) and to carry out processing in response to failure, such as a failover processing, as necessary. The above respective modules 20-90 are coupled by an internal bus for enabling mutual communication, with the internal bus installed on a connection board PL (to be described later) disposed in the disk controller 1.

Next, the functions of the modules 20-90 will be described.

CM Module 20

The CM module 20 is provided with a cache memory consisting of memory devices, the cache memory temporarily storing data to be written in the HDDs 3 transmitted from the host H and data read from the HDDs 3 according to a read request from the host H. The memory device may be flash memory, for example. The CM module 20 of the present embodiment is also provided with a battery package for supplying emergency power to the memory devices in order to protect the data stored in the cache memory from power failure.

MP Module 30

In the MP module 30, an MP is installed that executes a variety of control programs for implementing the functions of the disk controller 1. Although in this embodiment the MP employs a dual core configuration, a different multi-core configuration such as a quad core configuration can be employed. The MP module 30 is also installed with memory devices, such as shared memory storing the control programs executed by the MP and the control data, and other peripheral circuit components of the MP. With respect to amount of heat generated in the disk controller 1, the CM module 20 and the MP module 30 are particularly problematic.

PS Module 40

The PS module 40 is a power supply unit for supplying electric power in the disk controller 1. The PS module 40 is installed with a DC/DC converter for preparing power for controlling from electric power input from an external power source, and LC components for a filter circuit provided to cope with noise. It is to be noted that such a configuration, in which the PS modules 40 in the respective clusters are coupled to separate input power sources, is usually employed so as to improve availability of the disk controller 1 during failure of the power sources.

SVP Module 50

The SVP module 50 is provided with the functions of monitoring an operating condition of the disk controller 1 and the disk unit 2, and of enabling operational instructions to be input to the disk controller 1 and the disk unit 2 through an external input device. The SVP module 50 is typically configured as a computer installed on a single circuit board that executes various programs for implementing functions such as the monitoring and the operational instruction input, for example, with SNMP (Simple Network Management Protocol).

FICON Module 60

The FICON module 60 is provided with a communication interface function for coupling the storage apparatus S of the present embodiment to a legacy apparatus, for example a mainframe. The FICON module 60 is installed with a communication interface chip and its peripheral circuits for coupling to an FC network. In another embodiment, instead of FICON, an interface circuit for coupling to a mainframe according to ESCON (registered trademark) may be installed.

CHF Module 70

The CHF module 70 implements a communication interface function for coupling the disk controller 1 to the communication network N. In this embodiment, the CHF module 70 is installed with an FC interface chip and its peripheral circuits and the like for coupling the disk controller 1 to the communication network N configured as a SAN employing an FC protocol.

DKA Module 80

The DKA module 80 functions as a communication interface between the disk controller 1 and the disk unit 2 for data to be written, data that have been read, and various control data for the HDDs 3. The DKA module 80 is installed with an interface chip and its peripheral circuits and the like for implementing the above function.

SW Module 90

The SW module 90 has a communication interface function used when the disk controller 1 is coupled to another appropriate external apparatus. The SW module 90 is installed with circuit components for implementing the communication interface function.

It is to be noted that the allocation of the functions to the respective modules in the disk controller 1 is one example in the present embodiment, which does not limit the configuration of the present invention in any way.

External Appearance of Storage Apparatus S

FIG. 1B shows a perspective view of an example of the external appearance of the storage apparatus S of the present embodiment. The storage apparatus S includes a rack R in which the disk controller 1 and a plurality of disk units 2 are mounted in attachable/detachable manner.

The rack R has a front side portion R1 and a rear side portion R2 disposed at the back of the front side portion R1. As shown in FIG. 1B with outline thick arrows, cooling air for cooling the inside of the disk controller 1 and the disk units 2 is introduced from a front side of the rack R and is discharged from the rear side of the rack R.

Structure of Disk Controller 1

Next, referring to FIGS. 2A, 2B, 3A, and 3B, the structure of the disk controller 1 of the present embodiment will be described. FIG. 2A shows a perspective view of a disk controller 1 of the storage apparatus S as seen from a front side thereof. FIG. 2B shows a perspective view of a disk controller in FIG. 2A as seen from a rear side thereof. FIG. 3A shows a schematic elevational view of a disk controller 1 as seen from a front side thereof. FIG. 3B shows a schematic elevational view of a disk controller 1 as seen from a rear side thereof.

As shown in FIGS. 2A and 2B, the disk controller 1 of the present embodiment has a rack mount type structure of substantially rectangular parallelepiped shape. The disk controller 1 is configured to include a chassis 100 of substantially tube shape with a rectangular cross-section composed of a plurality of generally rectangular metal panels, the modules 20-90 stored in the chassis 100, and a plurality of cooling fans 10F, 10R (fans) for cooling the modules 20-90. Although the disk controller 1 is stored in the rack R illustrated in FIG. 1B with the disk units 2, the description will be given here focusing on the structure of the disk controller 1. Conversely, the technical scope of the present invention will not be affected by alteration of the configuration outside the disk controller 1.

It is to be noted that the cooling fans 10F, 10R are electric fans each having a capacity as required by design, and introduce cooling air into the modules 20-90 from the outside as is described later. As shown in FIGS. 2A-3B, the cooling fans 10F are disposed at the front side of the chassis 100, 6 vertically along the right side edge of the chassis 100, and 2 each at the top and bottom along the left side edge of the chassis 100. At the rear side of the chassis 100, the cooling fans 10R are disposed at the middle of the right side edge, 4 as forming a square shape.

The chassis 100 are configured in size and shape so as to store the modules 20-90 vertically as 12 stacked modules. In the present embodiment, as shown in FIGS. 2A and 3A, at the front side of the chassis 100, the CM modules 20 are disposed 4 each at the top and the bottom, with 4 MP modules 30 stored vertically in the middle. A structural example of each module and a mechanism for storing the module in the chassis 100 will be described later.

Each of the cooling fans 10F, 10R has a generally square cross-section, a length of the side being substantially equal to the height of 2 modules. The CM module 20 is placed between the two cooling fans 10F and the MP module 30 is placed adjacent the single cooling fan 10F positioned at the right side.

Next, referring to FIGS. 2B and 3B, at the rear side of the chassis 100, the PS module 40, the SVP module 50, the FICON module 60, the CHF module 70, the DKA module 80, and the SW module 90 are disposed, in that order, from the top as well as from the bottom. As a result, at both the front side and the rear side of the chassis 100, the modules 20-90 are arranged symmetrically vertically in the chassis 100. As shown in FIG. 3A, the upper group and the lower group of the modules each constitute the clusters C1 and C2. See FIG. 1A.

It is to be noted the arrangement of the modules 20-90 is not limited the one illustrated in the present embodiment. Meanwhile, in the present embodiment, for example, two of each of the PS modules 40, the FICON modules 60, and the CHF modules 70 are provided, however, the numbers of the respective modules 20-90 to be installed in the chassis 100 is not specifically limited to those illustrated herein.

As shown in FIGS. 2A and 2B, the connecting board PL is disposed in the chassis 100 substantially at the middle thereof as partitioning the inside of the chassis 100. The connecting board PL couples the modules 20-90 to each other, and is provided with a connector and a conductor pattern to be electrically coupled with the circuit boards in the modules 20-90. As will be described later, the coupling board PL is provide with apertures at predetermined positions for letting cooling air pass therethrough.

Structure of Modules 20-90

Next, referring to FIGS. 4A, 4B, a basic structure of the modules 20-90 will be described. FIG. 4A shows a schematic view of the external appearance of a module case 200 used as a circuit board case of the CM module 20. The module case 200 has a substantially flattened rectangular parallelepiped shape that is formed so as to enclose a circuit board 210 mounted therein with such parts as metal panels. According to this configuration, intrusion of external noise into the circuit board 210 is prevented.

At the back of the circuit board 210 is disposed a connector 220 for coupling a circuit on the circuit board 210 to the conductor pattern on the coupling board PL as projecting through a rear panel of the module case 200. The number of the connector 220 to be disposed on the modules 20-90 can be determined according to a design specification of the disk controller 1.

At both side surfaces of the module case 200, a plurality of openings 230 are disposed to introduce cooling air into the module case 200. The size and positions of the openings 230 can be determined according to the arrangement of heat-generating components on the circuit board 210 in the module case 200. In the example of FIG. 4A, the openings 230 are disposed at a proximal portion and a distal portion separately. In the example of FIG. 4A, projecting parts 240 (engaging parts) disposed on both side surfaces of the module case 200 at the most distal portion at the upper and the lower sides respectively are used for switching the openings 230 for introducing cooling air into the module case 200, as will be described later.

A pair of rails 250 are members that are projectingly provided generally horizontally and continuously to both side surfaces of the module case 200. Each rail 250 engages a receiver (not shown) having a recessed cross-section disposed on each side surface inside the chassis 100. In the case that the module case 200 is mounted from the front side or the rear side of the chassis 100, the module case 200 may be simply moved to the rear while the rails 250 are engaging with the respective receivers. A pair of operating levers 260 are disposed at both sides of the front bottom of the module case 200. The operating levers 260 are used when the module case 200 installed in the chassis 200 is detached therefrom. Instead of those in the present embodiment, any other forms of the rails 250 and the operating levers 260 can be appropriately employed that are ordinarily used in a chassis structure of rack mount type.

In FIG. 4B, another example of the structure of the module case 200 is shown. The structure illustrated in FIG. 4B is applied to the MP module 30 of the present embodiment, for example. The difference from the example in FIG. 4A lies in that the openings 230 are provided to the front side of the module case 200.

Cooling Structure of Disk Controller 1

Next, the cooling structure of the disk controller 1 of the present embodiment will be described. FIG. 5 is an elevational cross-sectional view of the disk controller 1 at A-A section in FIG. 3A, FIG. 6 is an elevational cross-sectional view at B-B section in FIG. 313. For clarity of illustration, it is to be noted that for each of the modules 20-90, illustration of the circuit components mounted on the circuit board 210 in the module case 200 is omitted except those specifically related to the description of the cooling structure.

In FIG. 5, as seen from the front side, each 4 layers from the top and the bottom of the chassis 100 are for storing the CM modules 20, and the middle 4 layers are for storing the MP modules 30. At both the top and the bottom, 2 cooling fans 10F are provided for 2 CM modules 20. Partitioning panels 110 are provided at sides of the chassis 100 facing each side surface of the CM modules 20 stored in the chassis 100. Openings 111 and 112 are provided to each partitioning panel 110 at positions corresponding to the openings 230 of the module case 200 of the CM module 20. To be described later, according to this configuration, the cooling air introduced by the cooling fans 10F is allowed to circulate through the apertures 111, 112 of the partitioning panels 110 and the openings 230 of the module case 200.

In FIG. 5, a vertical sectional view is shown with regard to the MP modules 30 in the 4 middle layers at the front side of the chassis 100. At the rear side of the chassis 100, a vertical sectional view is shown with regard to the PS modules 40, the SVP modules 50, the CHF modules 70, and the cooling fans 10R arranged at the rear side of the chassis 100. It is to be noted that in the example in FIG. 5, the FICON modules 60 are not installed in the chassis 100.

In FIG. 6 showing a vertical sectional view along line B-B of the disk controller 1, a section is illustrated taken at a position nearer the side surface of the chassis 100 than section A-A in FIG. 5. As shown in FIG. 6 illustrating a vertical section of the cooling fans 10F, each cooling fan 10F includes 2 fan units. However, the configuration of each cooling fan 10F can be determined considering the conditions with regard to air volume to be supplied, noise level, power consumption, shape/size, and the like. The above also applies to the cooling fans 10R arranged at the rear side of the chassis 100.

For each of the cooling fans 10F at the front side of the chassis 100, a pair of deflector plates 120A, 120B at the downstream of the cooling air flow path is provided. As will be described later, the deflector plate 120A is disposed to create a cooling air flow smoothly introduced through the aperture 111 at the chassis 100 side and the openings 230 of the module case 200 of the CM module 20 into the module case 200, utilizing the cooling air supplied from the cooling fan 10F. On the other hand, the deflector plate 120B has the function of smoothly guiding the cooling air discharged from the module case 200 of the CM module 20 through the openings 230, 112 into the rear side of the chassis 100 through the aperture 140 provided to the coupling board PL. It is to be noted that the deflector plates 120A, 120B may be configured so that an angle each of the deflector plates 120A, 120B forms with the cooling air flow can be adjusted. For example, such a configuration may be employed in that each of the deflector plates 120A, 120B is supported with a rotational shaft as rotatable therearound in the chassis 100.

The above-mentioned cooling structure for the CM module 20 will be described focusing on the cooling air flow created by the cooling fans 10F. FIGS. 7A, 7B show sectional plan views at C-C in FIG. 3A. As shown in FIGS. 7A and 7B, the circuit board 210 of the CM module 20 is provided with a plurality of memory slots 21 for mounting memory devices at the rear side of the board and a battery package 22 at the front side of the board in an attempt at high-density packaging. The amount of heat generated by the memory devices in the CM module 20 on writing and reading data is large, thus it leads to improvement in cooling efficiency to guide the cooling air flow from the cooling fans 10F so as to concentrate on the vicinity of the memory slots 21. Although FIG. 7B shows 2 of the memory slots 21, 3 or more memory slots may be provided.

In the present embodiment, as specifically shown in FIG. 7B clearly with thick arrows, the cooling air from the cooling fans 10F are guided by the deflector plates 120A to the vicinity of the memory slots 21 of the CM module 20 through the apertures 111 at the partitioning pane) 110 of the chassis 100 and the openings 230 of the module case 200. After cooling the memory devices in the CM module 20, the cooling air is discharged through the openings 230 and the apertures 111 at the partitioning panels 110. Then, the cooling air flow is guided by the deflector plates 120B to the apertures 140 of the coupling board PL. The cooling air flow passes the apertures 140 and enters into the module case 200 of the PS module 4Q through the openings 230 at the rear surface side panel of the module case 200, and is then discharged out of the PS module 40 through the openings 230 at the front side surface thereof after cooling the circuit components in the PS module 40.

In FIG. 8, there is shown a vertical sectional view of the disk controller 1 of the present embodiment at D-D in FIG. 3A. FIG. 8 corresponds to the vertical sectional view in FIG. 6 as taken at a symmetrical plane with respect to the center of the chassis 100. In the figure, the cooling structure of the CM modules 20 installed 4 each at the top and the bottom of the chassis 100 is the same as the structure described above. On the other hand, for the 4 layers at the middle of the chassis 100, 2 cooling fans 10F arranged at the right front side of the chassis 100 supply cooling air to the CHF modules 70, the DKA modules 80, and the SW modules 90 installed at the rear side of the chassis 100, which is different from the case of the CM modules 20.

Next, the cooling structure for the MP modules 30 will be described. FIGS. 9A, 9B show sectional plan views of the disk controller 1 at E-E in FIG. 3A. As shown in FIGS. 9A, 9B, the module case 200 constituting the MP module 30 is provided with the openings 230 at the front surface side as inlets for taking in cooling air from the outside. Unlike the structure of the CM module 20, in the MP module 30, no openings 230 are provided in the two lateral sides of the module case 200. With regard to the MP module 30, by suction of air out of the module case 200 constituting the MP module 30 by the cooling fans 10R arranged at the rear side of the chassis 100, negative pressure is produced inside the module case 200 which induces cooling air through the openings 230. Specifically as shown in FIG. 9B clearly with the thick arrows, the cooling air introduced into the MP module 30 through the openings 230 at the front side surface of the module case 200 cools heat-generating components in the MP module 30 such as the MPs 31 mounted on the circuit board 210 in the MP module 30. The cooling air is then guided to a flow path 160 through the openings 230 at the rear side surface of the module case 200 and the aperture 150 of the coupling board PL and discharged out of the chassis 100 by the cooling fans 10R. The air that has cooled the MP module 30 is discharged directly out of the chassis 100 without being used for cooling the other modules because a temperature of the cooling air has been sufficiently increased by cooling the circuit components such as the MPs generating relatively large amounts of heat.

On the other hand, as shown in FIG. 9B, cooling air introduced into a flow path 170 in the chassis 100 by the cooling fans 10F arranged at the front side of the chassis 100 is then further introduced into the SW module 90 through an aperture 180 of the coupling board PL and the openings 230 provided at the rear side surface of the module case 200 constituting the SW module 90. The cooling air which has cooled the circuit components mounted on the circuit board 210 in the SW module 90 is then discharged to the outside through the openings 230 at the front side surface of the module case 200. This cooling scheme for the SW module 90 is also applied to the DKA module 80 installed in the rear side of the chassis 100.

FIGS. 10A, 10B show sectional plan views at F-F in FIG. 3A. The cooling structure as described referring to FIGS. 7A, 7B is applied to the CM modules 20 installed at the bottom side of the chassis 100 as well.

Effects of Cooling Structure in the Present Embodiment

The effects achieved by the above-described cooling structure implemented in the disk controller 1 of the present embodiment now will be described. FIGS. 11A-11E show the cooling air flow in the disk controller 1 rendered visually through simulation.

FIG. 11A corresponding to the sectional plan view in FIG. 7B shows a cooling condition in the CM module 20. Since the cooling air flow in the CM module 20 appears substantially laterally symmetrical with respect to the center of the module as seen from the front side of the chassis 100, only the cooling air flow in the right half part of the CM module 20 is illustrated in FIG. 11A. In the figures, the cooling air flow is represented by a group of a number of arrows. A direction and a length of each arrow, and a density of the arrows, each indicate a flow direction, a flow velocity, and a flow rate qualitatively. Note that for technical reasons the deflector plates 120A, 1208 are not introduced as an element of the simulation.

As shown in FIG. 11A, the cooling air introduced into the chassis 100 by the cooling fans 10F arranged at the front side of the chassis 100 is guided into the CM module 20 through the apertures 111 (230). It can be appreciated that the cooling air concentrated to the vicinity of the memory devices attached to the memory slots 21 and having cooled the same exits the CM module 20 through the apertures 112 (230) and is guided to the rear side of the chassis 100 through the aperture 140 provided to the coupling board PL. According to the above, efficient cooling of the memory devices generating relatively large amounts of heat can be accomplished. In this case, if the deflector plates 102A, 120B are provided, the cooling air flow entering into and coming out of the CM module 20 can be smoothed and resistance along the flow path for the cooling air flow can be reduced.

FIG. 11B corresponding to the sectional plan view in FIG. 9B shows a cooling condition in the MP module 30. Unlike FIG. 11A, FIG. 11B shows an entire plan view of the MP module 30. As shown in FIG. 11B, by suction of the air out of the chassis 100 by the cooling fans 10R at the rear side of the chassis 100, the cooling air is introduced through the openings 230 at the front side surface of the module case 200 constituting the MP module 30. The cooling air introduced into the MP module 30 cools the MPs 31 mounted on the circuit board 210 at the substantially central part slightly shifted to the rear and is discharged through the aperture 150 of the coupling board PL to the flow path 160 at the rear side of the chassis 100. According to the above configuration of the present embodiment, efficient cooling of the MPs 31 that generate particularly large amounts of heat and the vicinity can be accomplished.

FIG. 11C corresponding to the sectional plan view in FIG. 10B shows a cooling condition of the right half part of the CM module 20 like FIG. 11A. According to FIG. 11C, as illustrated in FIG. 11A, it is appreciated that the vicinity of the memory slots 21 is efficiently cooled.

FIG. 11D indicates the cooling condition in which the module installed at the rear side of the chassis 100 (the CHF module 70 in this case) is cooled by the cooling fans 10F at the front side of the chassis 100. The cooling air introduced into the chassis 100 by the cooling fans 10F is guided into the CHF module 70 installed at the rear side of the chassis 100 through the aperture 180 of the coupling board PL. The cooling air then cools the circuit components in the CHF module 70 and is discharged to the outside through the openings 230 at the front side surface of the CHF module 70.

FIG. 11E shows a cooling condition of the right half part of the CM module 20 like FIG. 11A. FIG. 11E illustrates a sectional plan view of the CM module 20 including the FICON module 60 stored at the rear surface side of the chassis 100, the CM module 20 arranged at the top side or the bottom side of the chassis 100 as shown in FIGS. 3A and 3B. In this case, as described referring to FIG. 11A, it can be appreciated that the vicinity of the memory slots 21 in the CM module 20 is efficiently cooled.

As described above, according to the cooling structure of the disk controller 1 of the present embodiment, flow resistance along the flow path of the cooling air can be reduced as much as possible when cooling the circuit components generating relatively large amounts of heat such as the memory devices mounted in the CM module 20 and the MPs 31 mounted in the MP module 30, thereby providing efficient cooling of the above circuit components and installation of the circuit components of higher-density. If the flow resistance is further reduced by providing the deflector plates 120A, 120B, further improvement in cooling efficiency becomes possible.

Adjusting Mechanism for Cooling Air Flow Path

Next, an adjusting mechanism for adjusting the cooling air flow path that can be applied to the present embodiment will be described. FIGS. 12A, 12B are schematic views showing a configuration and an operation of the adjusting mechanism for the cooling air flow path. This flow path adjusting mechanism can be applied to, for example, the slot in which the CM module 20 of the present embodiment is stored.

Referring to FIGS. 12A, 12B, the module case 200 shown in FIG. 4A above and an internal structure of the chassis 100 storing the module case 200 are illustrated in schematic and perspective views. In this example, the module case 200 is configured to be stored in an inner frame 170 mounted in the chassis 100. At the inner side surfaces of the inner frame 170, there are provided openings 171A, 171B constituting a part of the flow path of the cooling air. At the inner side surfaces of the inner frame 170, adjustable shutter assemblies 151 (an opening and closing mechanism) which constitutes a part of the flow path adjusting mechanism are provided.

Each of the adjustable shutter assemblies 151 includes openings 152A, 152B disposed corresponding to the openings 171A, 171B of the inner frame 170. The openings 152A, 152B can be selectively opened and closed with a shutter plate 168 (shutter member). The shutter plate 168 is attached to the adjustable shutter assembly 151 at such a position that the opening 152A is shut in an initial state. The shutter plate 168 is made slidable in a substantially horizontal direction with respect to the adjustable shutter assembly 151 with an appropriate supporting mechanism. The shutter plate 168 is provided with an engaging portion 161 at the end thereof toward the rear of the chassis 100. The engaging portion 161 is formed by bending substantially at a right angle an end part thereof. The engaging portion 161 is positioned at an end of the opening 152B toward the front side of the chassis 100 in an initial state.

As described referring to FIG. 4A, the projecting parts 240 (engaging part) are optionally provided to the module case 200 at the end toward the rear of the chassis 100. While the module case 200 is moved toward the back of the inner frame 170 with the rails 250 engaging and sliding along the receiver 153 of the adjustable shutter assembly 151, the projecting parts 240 of the module case 200 contact the engaging portion 161 of the shutter plate 168 at the position where the module case 200 is generally moved halfway in a full stroke. When the module case 200 is moved beyond that point, the projecting parts 240 force the shutter plate 168 with the engaging portion 161 to slide toward the rear of the chassis 100. When the module case 200 is fully stored in the inner frame 170, that is, in the chassis 100, the shutter plate 168 remains at a position such that the shutter plate 161 completely closes the opening 152B of the adjustable shutter assembly 151 and the opening 152A is opened instead. As described above, when the module case 200 having the projecting parts 240 is stored in the chassis 100 having the flow path adjusting mechanism, the opening 152B establishes the cooling air flow path and the cooling air is guided to flow mainly into a front side (proximal side) of the chassis 100 in the module case 200.

On the other hand, when the module case 200 without the projecting parts 240 is stored in the chassis 100, the shutter plate 168 is not moved as in the above description. Thus, the shutter plate 168 stays at the initial position and the opening 152B establishes the cooling air flow path. As a result, the cooling air is guided to enter mainly into the module case 200 toward the rear side (distal side) of the chassis 100. According to the above configuration, depending on whether or not the projecting parts 240 are provided to the module case 200, the cooling air can be selectively guided toward the proximal side or the distal side in the module case 200. Thus, the cooling air flow path can be adjusted according to the arrangement of the heat-generating circuit components on the circuit board 210 in the module case 200. This enables further improvement of cooling efficiency for the circuit components mounted in the disk controller 1. It is to be noted that providing the projecting parts 240 selectively on either side of the module case 200 allows opening a proximal opening (first aperture) at one side of the module case 200 and a distal opening (second aperture) at the other side of the module case 200, thereby enabling more precise control of a portion to which the cooling air is introduced in the module case 200.

It is to be noted that a device which creates a restoring force against the movement of the shutter plate 168, for example, a resilient member such as a small coil spring 162, may be provided between the shatter plate 168 and the adjusting shutter assembly 151. According to this configuration, the shutter plate 168 is forced to move back to the initial position where the opening 152A is closed when the module case 200 is removed from the chassis 100 (inner frame 170).

As described above according to one embodiment of the present invention, the present invention is able to provide a storage apparatus, a storage controller for a storage apparatus, and a chassis for a storage controller that provides efficient cooling of and around heat-generating circuit components disposed on circuit boards.

Although the present invention has been described in terms of the examples thereof with reference to the accompanying drawings, the present invention is not limited to these examples. All modifications and equivalents not departing from the spirit of the present invention fall within the range of the present invention.

The invention claimed is:

1. A storage apparatus comprising:
   physical storage media for creating a logical storage area; and
   a storage controller communicatively coupled with the physical storage media for controlling data input/output (I/O) processing between an external apparatus and the physical storage media,
   wherein the storage controller includes:
   a plurality of circuit board modules each having a circuit board implementing a predetermined function of the storage controller, and a circuit board case storing the circuit board, and
   a chassis having a hollow container with a front side opening and a rear side opening, configured to store the plurality of circuit board modules from the front and rear side openings,
   wherein the plurality of circuit board modules include:
   a first circuit board module to be inserted from the front side opening, configured to introduce cooling air through an opening provided on at least one side surface of the circuit board case toward a circuit component mounted on the circuit board, and
   a second circuit board module to be inserted from the rear side opening of the chassis, configured to introduce cooling air through an opening provided on a front surface of the circuit board case toward the circuit component mounted on the circuit board,
   wherein the storage controller further includes:
   a first fan arranged adjacent to the first circuit board module from the front side opening of the chassis, supplying cooling air through the opening provided on the side surface of the first circuit board module,
   a second fan positioned at the rear side of the second circuit board module from the rear side opening of the chassis, configured to introduce cooling air through the opening at the front side surface of the second circuit board module by suction of air out of the second circuit board module, and
   a third circuit board module, to be inserted from the rear side opening to oppose the first circuit board module, configured to introduce cooling air from the first circuit board module through an opening provided on the front side surface of the circuit board case,
   wherein the opening provided on the side surface of the first circuit board case of the circuit board module includes a first aperture and a second aperture, the first aperture positioned at a proximal part of the side surface when the first circuit board module is stored in the chassis, the second aperture positioned at a distal part of the side surface when the second circuit board module is stored in the chassis,
   wherein the chassis is provided with first and second deflector plates, the first deflector plate guiding the cooling air from the first fan to the first aperture, the second deflector plate guiding the cooling air flowing out of the second aperture into the third circuit board modules inserted from the rear side opening of the chassis, and wherein the second fan is configured to introduce cooling air by suction toward the second circuit board module as well as allow cooling air from the second circuit board module flow through a flow path in the chassis to be discharged from the rear side opening.

2. The storage apparatus according to claim 1, wherein a coupling board is provided between the front side opening and the rear side opening of the chassis to partition the hollow container, the coupling board including a conductor electrically coupled with the circuit board modules inserted from the front side opening and from the rear side opening, wherein the coupling board is provided with a plurality of apertures that allow cooling air from the front side opening to the rear side opening of the chassis, wherein the cooling air flowing out of a first circuit board module is introduced into another circuit board module stored from the rear side opening of the chassis to cool the circuit board installed therein, wherein the opening provided on the side surface of the circuit board case of the circuit board module includes a first aperture and a second aperture, the first aperture positioned at a proximal part of the side surface when the first circuit board module is stored in the chassis, the second aperture positioned at a distal part of the side surface when the second circuit board module is stored in the chassis, wherein the chassis is provided with an opening and closing mechanism to selectively put the first aperture or the second aperture in an opened condition or a closed condition, wherein the opening and closing mechanism is disposed in the chassis at a position opposite the first aperture and the second aperture of the circuit board case of the first circuit board module, wherein the opening and closing mechanism has a shutter member selectively opening or closing the first aperture or the second aperture when the first circuit board module is installed in the chassis, wherein the shutter member provided with the chassis is positioned to close the first aperture of the first circuit board module at an initial state, wherein an engaging part configured to engage the shutter member is provided to at least one side surface of the circuit board case constituting the first circuit board module, wherein the engaging part moves the shutter member to a position where the shutter member closes the second aperture when the first circuit board module is inserted in the chassis, wherein the storage controller includes a third fan stored in the chassis from the front side opening adjacent to either of inner side surfaces of the chassis, wherein the cooling air suctioned by the third fan through the front side opening is introduced into the circuit board case of the circuit board module inserted from the rear side opening of the chassis, wherein the first circuit board module stores the circuit board on which a memory device is mounted, the memory device constituting cache memory temporarily storing data to be written to and read from the physical storage media, wherein the second circuit board module stores the circuit board on which a processor that carries out data processing to implement functions of the storage controller is mounted, and wherein the physical storage media include a plurality of hard disk drives, and the logical storage area is created from a RAID group formed by the plurality of hard disk drives.

3. The storage apparatus according to claim 1, wherein a coupling board is provided between the front side opening and the rear side opening of the chassis to partition the hollow container, the coupling board including a conductor electrically coupled with the circuit board modules inserted from the front side opening and from the rear side opening, and wherein the coupling board is provided with a plurality of apertures that allow cooling air from the front side opening to the rear side opening of the chassis.

4. The storage apparatus according to claim 1, wherein the cooling air flowing out of the first circuit board module is introduced into another circuit board module stored from the rear side opening of the chassis to cool the circuit board installed therein.

5. The storage apparatus according to claim 1, wherein the opening provided on the side surface of the circuit board case of the circuit board module includes a first aperture and a second aperture, the first aperture positioned at a proximal part of the side surface when the first circuit board module is stored in the chassis, the second aperture positioned at a distal part of the side surface when the second circuit board module is stored in the chassis, and wherein the chassis is provided with an opening and closing mechanism to selectively put the first aperture or the second aperture in an opened condition or a closed condition.

6. The storage apparatus according to claim 5, wherein the opening and closing mechanism is disposed in the chassis at a position opposite the first aperture and the second aperture of the circuit board case of the first circuit board module, and wherein the opening and closing mechanism has a shutter member selectively opening or closing the first aperture or the second aperture when the first circuit board module is installed in the chassis.

7. The storage apparatus according to claim 6, wherein the shutter member provided with the chassis is positioned to close the first aperture of the first circuit board module at an initial state, and wherein an engaging part configured to engage the shutter member is provided to at least one side surface of the circuit board case constituting the first circuit board module, and wherein the engaging part moves the shutter member to a position where the shutter member closes the second aperture when the first circuit board module is inserted in the chassis.

8. The storage apparatus according to claim 1, wherein the storage controller includes a third fan stored in the chassis from the front side opening adjacent to either of inner side surfaces of the chassis, and wherein the cooling air suctioned by the third fan through the front side opening is introduced into the circuit board module inserted from the rear side opening of the chassis.

9. The storage apparatus according to claim 1, wherein the first circuit board module stores the circuit board on which a memory device is mounted, the memory device constituting cache memory temporarily storing data to be written to and read from the physical storage media.

10. The storage apparatus according to claim 1, wherein the second circuit board module stores the circuit board on which a processor carrying out data processing to implement function of the storage controller is mounted.

11. The storage apparatus according to claim 1, wherein the physical storage media include a plurality of hard disk drives, and the logical storage area is created from a RAID group formed by the plurality of hard disk drives.

12. A storage controller for a storage apparatus, the storage apparatus including physical storage media for creating a logical storage area to be used as a data storage area for an external apparatus, the storage controller communicatively coupled with the physical storage media for controlling data input/output (I/O) processing between the external apparatus and the logical storage area, the storage controller comprising:
- a plurality of circuit board modules each having a circuit board implementing a predetermined function of the storage controller, and a circuit board case storing the circuit board; and
- a chassis having a hollow container with a front side opening and a rear side opening, configured to store the plurality of circuit board modules from the front and rear side openings, the plurality of circuit board modules including a first circuit board module to be inserted from the front side opening, configured to introduce cooling air through an opening provided on at least one side surface of the circuit board case toward a circuit component mounted on the circuit board, and a second circuit board module to be inserted from the rear side opening of the chassis, configured to introduce cooling air through an opening provide on a front surface of the circuit board case toward the circuit component mounted on the circuit board;
- a first fan arranged adjacent to the first circuit board module from the front side opening of the chassis, supplying cooling air through the opening provided on the side surface of the first circuit board module; and
- a second fan positioned at the rear side of the second circuit board module from the rear side opening of the chassis, configured to introduce cooling air through the opening at the front side surface of the second circuit board module by suction of air out of the second circuit board module,
wherein the storage controller further includes:
- a third circuit board module, to be inserted from the rear side opening to oppose the first circuit board module, configured to introduce cooling air from the first circuit board module through an opening provided on the front side surface of the circuit board case,
wherein the opening provided on the side surface of the first circuit board case of the circuit board module includes a first aperture and a second aperture, the first aperture positioned at a proximal part of the side surface when the first circuit board module is stored in the chassis, the second aperture positioned at a distal part of the side surface when the second circuit board module is stored in the chassis,
wherein the chassis is provided with first and second deflector plates, the first deflector plate guiding the cooling air from the first fan to the first aperture, the second deflector plate guiding the cooling air flowing out of the second aperture into the third circuit board modules inserted from the rear side opening of the chassis, and
wherein the second fan is configured to introduce cooling air by suction toward the second circuit board module as well as allow cooling air from the second circuit board module flow through a flow path in the chassis to be discharged from the rear side opening.

13. A chassis for the storage controller according to claim 12, wherein the chassis is provided with an opening and closing mechanism to selectively put the first aperture or the second aperture in an opened condition or a closed condition,
wherein the opening and closing mechanism is disposed in the chassis at a position opposite the first aperture and the second aperture of the circuit board case of the first circuit board module,
wherein the opening and closing mechanism has a shutter member selectively opening or closing the first aperture or the second aperture when the first circuit board module is installed in the chassis,
wherein the shutter member provided with the chassis is positioned to close the first aperture of the first circuit board module at an initial state,
wherein an engaging part configured to engage the shutter member is provided to at least one side surface of the circuit board case constituting the first circuit board module, and
wherein the engaging part moves the shutter member to a position where the shutter member closes the second aperture.

* * * * *